(12) United States Patent
Hendrix et al.

(10) Patent No.: US 10,385,452 B2
(45) Date of Patent: Aug. 20, 2019

(54) SOURCE REAGENT-BASED DELIVERY OF FLUID WITH HIGH MATERIAL FLUX FOR BATCH DEPOSITION

(71) Applicant: Entegris, Inc., Billerica, MA (US)

(72) Inventors: Bryan C. Hendrix, Danbury, CT (US); John N. Gregg, Marble Falls, TX (US); Scott L. Battle, Cedar Park, TX (US); Donn K. Naito, Marble Falls, TX (US); Kyle Bartosh, Whitehall, PA (US); John M. Cleary, New Fairfield, CT (US); Sebum Cheon, New Milford, CT (US); Jordan Hodges, Cedar Park, TX (US)

(73) Assignee: ENTEGRIS, INC., Billerica, MA (US)

( * ) Notice: Subject to any disclaimer, the term of this patent is extended or adjusted under 35 U.S.C. 154(b) by 231 days.

(21) Appl. No.: 14/404,633

(22) PCT Filed: May 31, 2013

(86) PCT No.: PCT/US2013/043592
§ 371 (c)(1),
(2) Date: Nov. 30, 2014

(87) PCT Pub. No.: WO2013/181521
PCT Pub. Date: Dec. 5, 2013

(65) Prior Publication Data
US 2015/0191819 A1 Jul. 9, 2015

Related U.S. Application Data

(60) Provisional application No. 61/654,077, filed on May 31, 2012.

(51) Int. Cl.
*C23C 16/44* (2006.01)
*C23C 16/458* (2006.01)
(Continued)

(52) U.S. Cl.
CPC ............ *C23C 16/458* (2013.01); *B01B 1/005* (2013.01); *C23C 16/4402* (2013.01); *C23C 16/4481* (2013.01); *C23C 16/455* (2013.01)

(58) Field of Classification Search
CPC ......... G01L 1/16; G01L 5/167; C23C 16/458; C23C 16/455; C23C 16/4402; C23C 16/4481; B01B 1/005
(Continued)

(56) References Cited

U.S. PATENT DOCUMENTS 1,265,863 A   5/1918   Abbot, Jr.
2,447,789 A   8/1948   Barr
(Continued)

FOREIGN PATENT DOCUMENTS

CN   1452507 A     10/2003
CN   101905126 A   12/2010
(Continued)

OTHER PUBLICATIONS

Boomsma, K., et al., "Metal foams as compact high performance heat exchangers", "Mechanics of Materials", Dec. 2003, pp. 1161-1176, vol. 35, No. 12.
(Continued)

*Primary Examiner* — Rudy Zervigon
(74) *Attorney, Agent, or Firm* — Entegris, Inc.

(57) ABSTRACT

Systems, reagent support trays, particle suppression devices, and methods are disclosed. In one aspect, a system includes a vaporizer vessel having one or more interior walls enclosing an interior volume and a plurality of reagent support trays configured to be vertically stackable within the interior volume. Each of the plurality of reagent support trays is configured to be vertically stackable within the interior volume to form a stack of reagent support trays. One or more of the plurality of reagent support trays is configured to
(Continued)

redirect a flow of a gas passing between adjacent reagent support trays in the stack of reagent support trays to cause the flow of gas to interact with the source reagent material in a particular reagent support tray before passing into a next of the plurality of reagent support trays in the stack of reagent support trays.

22 Claims, 16 Drawing Sheets

(51) Int. Cl.

| | |
|---|---|
| *C23C 16/448* | (2006.01) |
| *C23C 16/455* | (2006.01) |
| *B01B 1/00* | (2006.01) |

(58) Field of Classification Search
USPC ........................ 118/715; 156/345.33, 345.34
See application file for complete search history.

(56) References Cited

U.S. PATENT DOCUMENTS

| | | | |
|---|---|---|---|
| 2,721,064 A | 10/1955 | Reichardt | |
| 2,769,624 A | 11/1956 | Burnside | |
| 2,902,574 A | 9/1959 | Gudmundsen et al. | |
| 3,405,251 A | 10/1968 | Spriggs R et al. | |
| 3,647,197 A | 3/1972 | Holloway | |
| 3,740,043 A | 6/1973 | Reed et al. | |
| 3,834,682 A | 9/1974 | McPhee | |
| 3,920,882 A | 11/1975 | Venkatu | |
| 4,105,821 A | 8/1978 | Blaich et al. | |
| 4,190,965 A | 3/1980 | Erickson | |
| 4,916,828 A | 4/1990 | Yamane et al. | |
| 5,020,476 A | 6/1991 | Bay et al. | |
| 5,078,976 A | 1/1992 | Shibauchi et al. | |
| 5,104,695 A | 4/1992 | Greer et al. | |
| 5,336,324 A | 8/1994 | Stall et al. | |
| 5,377,429 A | 1/1995 | Sandhu et al. | |
| 5,476,547 A | 12/1995 | Mikoshiba et al. | |
| 5,536,323 A | 7/1996 | Kirlin et al. | |
| 5,553,188 A | 9/1996 | Ewing | |
| 5,553,395 A | 9/1996 | Wen et al. | |
| 5,603,169 A | 2/1997 | Kim | |
| 5,711,354 A | 1/1998 | Siegele et al. | |
| 5,722,184 A | 3/1998 | Onoe et al. | |
| 5,764,849 A | 6/1998 | Atwell | |
| 5,904,771 A | 5/1999 | Tasaki et al. | |
| 5,917,140 A | 6/1999 | Tom | |
| 6,020,511 A | 2/2000 | Vaartstra et al. | |
| 6,039,808 A | 3/2000 | Toyoda et al. | |
| 6,107,634 A | 8/2000 | Horsky | |
| 6,126,996 A | 10/2000 | Kirlin et al. | |
| 6,136,725 A | 10/2000 | Loan et al. | |
| 6,143,191 A | 11/2000 | Baum et al. | |
| 6,149,975 A | 11/2000 | Tasaki et al. | |
| 6,202,591 B1 | 3/2001 | Witzman et al. | |
| 6,210,485 B1 | 4/2001 | Zhao et al. | |
| 6,237,529 B1 | 5/2001 | Spahn | |
| 6,254,792 B1 | 7/2001 | Van Buskirk et al. | |
| 6,270,839 B1 * | 8/2001 | Onoe | C23C 16/4481 118/726 |
| 6,281,124 B1 | 8/2001 | Vaartstra | |
| 6,288,403 B1 | 9/2001 | Horsky et al. | |
| 6,359,159 B1 | 3/2002 | Welch et al. | |
| 6,409,839 B1 | 6/2002 | Sun et al. | |
| 6,413,476 B1 | 7/2002 | Barnhart | |
| 6,431,118 B1 | 8/2002 | Woltmann | |
| 6,443,435 B1 | 9/2002 | Hendrickson | |
| 6,470,144 B1 | 10/2002 | Tarutani et al. | |
| 6,473,564 B1 | 10/2002 | Nagashima et al. | |
| 6,548,683 B1 | 4/2003 | Vaartstra | |
| 6,581,915 B2 | 6/2003 | Bartsch et al. | |
| 6,607,785 B2 | 8/2003 | Timmons et al. | |
| 6,616,766 B2 | 9/2003 | Dunham | |
| 6,620,225 B2 | 9/2003 | Wang et al. | |
| 6,620,256 B1 | 9/2003 | Arno et al. | |
| 6,701,066 B2 | 3/2004 | Sandhu | |
| 6,718,126 B2 | 4/2004 | Lei | |
| 6,779,378 B2 | 8/2004 | Bondestam | |
| 6,797,337 B2 | 9/2004 | Dando et al. | |
| 6,828,256 B2 | 12/2004 | Vaartstra | |
| 6,837,939 B1 | 1/2005 | Klug et al. | |
| 6,841,141 B2 | 1/2005 | Arno et al. | |
| 6,863,021 B2 | 3/2005 | Sneh | |
| 6,887,337 B2 | 5/2005 | Lebouitz et al. | |
| 6,905,541 B2 | 6/2005 | Chen et al. | |
| 6,909,839 B2 | 6/2005 | Wang et al. | |
| 6,915,592 B2 | 7/2005 | Guenther | |
| 6,921,062 B2 | 7/2005 | Gregg et al. | |
| 6,991,671 B2 | 1/2006 | Brestovansky et al. | |
| 7,018,940 B2 | 3/2006 | Dunham | |
| 7,048,785 B2 | 5/2006 | Wang et al. | |
| 7,109,113 B2 | 9/2006 | Derderian | |
| 7,122,085 B2 | 10/2006 | Shero et al. | |
| 7,128,785 B2 | 10/2006 | Kaeppeler et al. | |
| 7,186,385 B2 | 3/2007 | Ganguli et al. | |
| 7,261,118 B2 | 8/2007 | Birtcher et al. | |
| 7,294,208 B2 * | 11/2007 | Guenther | C23C 16/4481 118/715 |
| 7,300,038 B2 | 11/2007 | Gregg et al. | |
| 7,413,767 B2 | 8/2008 | Bauch et al. | |
| 7,484,315 B2 | 2/2009 | Suzuki et al. | |
| 7,485,338 B2 | 2/2009 | Faguet | |
| 7,487,956 B2 | 2/2009 | Gregg et al. | |
| 7,488,512 B2 | 2/2009 | Suzuki et al. | |
| 7,524,374 B2 | 4/2009 | Chen et al. | |
| 7,556,244 B2 | 7/2009 | Gregg et al. | |
| 7,638,002 B2 | 12/2009 | Suzuki et al. | |
| 7,651,570 B2 | 1/2010 | Brcka | |
| 7,708,835 B2 * | 5/2010 | Suzuki | C23C 16/4481 118/726 |
| 7,828,274 B2 | 11/2010 | Gregg et al. | |
| 7,846,256 B2 | 12/2010 | Suzuki | |
| 8,128,073 B2 | 3/2012 | Gregg et al. | |
| 8,146,896 B2 | 4/2012 | Cuvalci et al. | |
| 8,444,120 B2 | 5/2013 | Gregg et al. | |
| 8,708,320 B2 | 4/2014 | Steidl et al. | |
| 2001/0003603 A1 | 6/2001 | Eguchi et al. | |
| 2001/0008121 A1 | 7/2001 | Tanabe et al. | |
| 2002/0145210 A1 | 10/2002 | Tompkins et al. | |
| 2002/0192370 A1 | 12/2002 | Metzner et al. | |
| 2003/0053799 A1 | 3/2003 | Lei | |
| 2003/0054099 A1 | 3/2003 | Jurgensen et al. | |
| 2003/0101938 A1 | 6/2003 | Ronsse et al. | |
| 2003/0111014 A1 | 6/2003 | Donatucci et al. | |
| 2003/0116019 A1 | 6/2003 | Torkaman | |
| 2003/0119312 A1 | 6/2003 | Vaartstra | |
| 2003/0121608 A1 | 7/2003 | Chen et al. | |
| 2003/0232138 A1 | 12/2003 | Tuominen et al. | |
| 2004/0013558 A1 | 1/2004 | Kondoh et al. | |
| 2004/0083787 A1 | 5/2004 | Bondestam | |
| 2004/0165870 A1 | 8/2004 | Sandhu | |
| 2005/0000427 A1 | 1/2005 | Lee et al. | |
| 2005/0006799 A1 | 1/2005 | Gregg | |
| 2005/0230046 A1 | 10/2005 | Lebouitz et al. | |
| 2006/0024439 A2 | 2/2006 | Tuominen et al. | |
| 2006/0030163 A1 | 2/2006 | Vaartstra | |
| 2006/0037540 A1 | 2/2006 | Woelk et al. | |
| 2006/0121198 A1 | 6/2006 | Shenai-Khatkhate et al. | |
| 2006/0185597 A1 | 8/2006 | Suzuki et al. | |
| 2007/0042119 A1 | 2/2007 | Matthysse et al. | |
| 2007/0194470 A1 | 8/2007 | Dedontney | |
| 2007/0266949 A1 | 11/2007 | Shenai-Khatkhate | |
| 2008/0085226 A1 | 4/2008 | Fondurulia et al. | |
| 2008/0092816 A1 | 4/2008 | Birtcher et al. | |
| 2008/0191153 A1 | 8/2008 | Marganski et al. | |
| 2009/0107401 A1 | 4/2009 | Reinhold et al. | |
| 2009/0181168 A1 * | 7/2009 | Chaubey | C23C 16/4481 427/248.1 |
| 2010/0255198 A1 * | 10/2010 | Cleary | C23C 16/4402 427/255.39 |

(56) References Cited

U.S. PATENT DOCUMENTS

| | | |
|---|---|---|
| 2010/0322604 A1 | 12/2010 | Fondurulia et al. |
| 2013/0228476 A1 | 9/2013 | Gregg et al. |
| 2014/0329025 A1 | 11/2014 | Cleary et al. |

FOREIGN PATENT DOCUMENTS

| | | |
|---|---|---|
| DE | 3931189 A1 | 3/1991 |
| DE | 19638100 C1 | 3/1998 |
| EP | 0714999 A1 | 6/1996 |
| EP | 1508631 A1 | 2/2005 |
| EP | 1669474 A1 | 6/2006 |
| GB | 1559978 A | 1/1980 |
| JP | 55-160424 A | 12/1980 |
| JP | 58-126973 A | 7/1983 |
| JP | 60-70176 A | 4/1985 |
| JP | 2-107593 A | 4/1990 |
| JP | 3-72387 A | 3/1991 |
| JP | 4-36469 A | 2/1992 |
| JP | 4-228562 A | 8/1992 |
| JP | 4-292406 A | 10/1992 |
| JP | 4-333572 A | 11/1992 |
| JP | 5-19351 A | 1/1993 |
| JP | 5-98445 A | 4/1993 |
| JP | 8-279497 A | 10/1996 |
| JP | 11-278997 A | 10/1999 |
| JP | 2000104172 A | 4/2000 |
| JP | 2001-59161 A | 3/2001 |
| JP | 2001-59178 A | 3/2001 |
| JP | 2002-270523 A | 9/2002 |
| JP | 2004100035 A | 4/2004 |
| JP | 2008501507 A | 1/2008 |
| KR | 10-2005-0030963 A | 3/2005 |
| KR | 10-2006-0064556 A | 6/2006 |
| WO | 9312266 A1 | 6/1993 |
| WO | 9421840 A1 | 9/1994 |
| WO | 9904061 A1 | 1/1999 |
| WO | 0065127 A1 | 11/2000 |
| WO | 0161071 A2 | 8/2001 |
| WO | 0183084 A1 | 11/2001 |
| WO | 03004723 A1 | 1/2003 |
| WO | 2004010463 A2 | 1/2004 |
| WO | 2004011695 A2 | 2/2004 |
| WO | 2006009872 A1 | 1/2006 |
| WO | 2006101767 A2 | 9/2006 |
| WO | 2008028170 A2 | 3/2008 |
| WO | 2008045972 A2 | 4/2008 |
| WO | 2013/181521 A2 | 12/2013 |

OTHER PUBLICATIONS

Palko, A., et al., "The Vapor Pressures of Zirconium Tetrachloride and Hafnium Tetrachloride", "J. Phys. Chem.", Mar. 1958, pp. 319-322, vol. 62.

* cited by examiner

SOURCE REAGENT-BASED DELIVERY OF FLUID WITH HIGH MATERIAL FLUX FOR BATCH DEPOSITION

CROSS-REFERENCE TO RELATED APPLICATION

The benefit of priority of U.S. Provisional Patent Application No. 61/654,077 filed May 31, 2012 in the names of Bryan C. Hendrix, et al. for "SOURCE REAGENT-BASED DELIVERY OF FLUID WITH HIGH MATERIAL FLUX FOR BATCH DEPOSITION" is hereby claimed under 35 USC 119. The disclosure of U.S. Provisional Patent Application No. 61/654,077 is hereby Incorporated herein by reference, in its entirety, for all purposes.

FIELD

The present disclosure relates to vaporization apparatuses and systems, and related methodologies for vaporization of source reagent materials, such as liquid and solid source reagents used in chemical vapor deposition (CVD), atomic layer deposition (ALD) and ion implantation processes.

BACKGROUND

In the use of liquids and solid materials as source reagents for vapor in CVD, ALD and ion implantation, various reagents materials are employed. The reagent materials may be heated to form source reagent vapor that is delivered to process equipment for deposition or implantation. To achieve successful CVD, ALD, and ion implantation, the source reagent vapor should be supplied at a consistent, controlled, and reproducible rate.

In producing reagent vapor, such as for single wafer deposition or implantation, it is important to uniformly heat the source reagent material. There may be significant differences in boiling points and sublimation temperatures of source reagents to be vaporized. If the source reagent material is not heated uniformly, cold spots or hot spots may exist among units of the source reagent material, and such non-uniform heating may result in fluctuations in the reagent vapor flow. It is also desirable to circulate carrier gas among the source reagent material and the reagent vapor generated to mix the carrier gas and the source reagent vapor generated by the source reagent material.

Solid source reagents are particularly difficult to control in volatilization applications where sublimation temperatures are close to temperatures at which thermal disassociation occurs and yields thermal degradation by-products that are detrimental to the downstream deposition or ion implantation process. Solid source delivery also can be complicated by surface morphology of the solid source reagent changing during volatilization and depletion of the solid source material during volatilization, both of which may result in a change in the surface area of the solid source material that is exposed to the carrier gas.

Producing reagent vapor for deposition or implantation of batches of multiple wafers poses further problems. Deposition or implantation of batches of wafers may necessitate a greater flow of reagent vapor. A greater flow of vapor may require heating of large batches of source reagent material that, in turn, may require use of a larger vaporizer vessel and larger support structures to accommodate the source reagent material. Using a larger quantity of source reagent material in a larger vaporizer vessel may make it more difficult to consistently engage a carrier gas with the source reagent material and reagent vapor generated by the source reagent material to efficiently entrain the reagent vapor in the resulting gas mixture. Further, uniform heating of larger batches of source reagent material may be more difficult than uniformly heating small batches of source reagent material. Producing greater quantities of reagent vapor also may necessitate replacing batches of source reagent material more frequently, so it may be desirable to simplify the task of reloading the source reagent material in the heating apparatus.

At the same time, concerns related to preventing non-vaporous particles from passing into the reagent vapor flow for a relatively small flow of reagent vapor may be magnified when generating a larger flow of reagent vapor. Heating larger quantities of source reagent materials may result in production of greater quantities of particles as a result of thermal decomposition during heating. Flows of reagent vapors may be filtered to prevent these unwanted particles from being introduced into the deposition or implantation process. However, filtering out particles from a larger flow of reagent vapor, such as may be used for batch deposition or implantation, may be more complex than filtering a lesser flow of reagent vapor.

SUMMARY

The present disclosure relates to vaporizer vessel apparatus and systems, and related methodologies for vaporization of source reagent materials used in chemical vapor deposition (CVD), atomic layer deposition (ALD) and ion implantation processes. In a particular embodiment, the vaporizer vessel is configured to generate a large volume of reagent vapor to permit deposition and implantation of the reagent vapor for a batch of wafers or other objects, rather than for a single wafer or object.

According to the present disclosure, reagent support trays within a stack of reagent support trays for use in a vaporizer vessel include a plurality of gas flow openings. The gas flow openings may include channels in one or more dividers within a reagent support tray or may be positioned at one side of one or more of the reagent support trays. The channels in the dividers may be arranged to extend below a bottom face of particular reagent support tray to redirect a gas at the bottom face of the support tray to circulate away from the bottom face of the support tray before it can pass into a next reagent support tray. Alternatively, with side-disposed gas flow openings, a gas flowing into a reagent support tray at one side of a vaporizer vessel is redirected to flow across the reagent support tray (and reagent source material received therein) before passing out of the reagent support tray into a next reagent support tray via an opening disposed toward the other side of the vaporizer vessel.

According to embodiments of the disclosure, a system includes a vaporizer vessel having one or more interior walls enclosing an interior volume and a plurality of reagent support trays configured to be vertically stackable within the interior volume. Each of the plurality of reagent support trays is configured to be vertically stackable within the interior volume to form a stack of reagent support trays. One or more of the plurality of reagent support trays is configured to redirect a flow of a gas passing between adjacent reagent support trays in the stack of reagent support trays to cause the flow of gas to interact with the source reagent material in a particular reagent support tray before passing into a next of the plurality of reagent support trays in the stack of reagent support trays.

In one aspect, each of the plurality of reagent support trays includes at least one divider extending at least partially across the support surface. The at least one divider has a lower end extending a first distance below the bottom face and an upper end, and at least one channel extending through the at least one divider between the lower end and the upper end. As a result, gas below the bottom face is forced to circulate away from the bottom face to reach the at least one channel at the lower end of the at least one divider.

In another aspect, each of the plurality of reagent support trays includes a gas flow opening positioned at one side of the support surface. The gas flow opening is configured to enable a gas to flow from below the bottom face to above the top face. The plurality of reagent support trays are configured to be included in a stack with the gas flow opening of a reagent support tray of the plurality of regent support trays being disposed at a first side of the stack and the gas flow opening of a superjacent reagent support tray of the plurality of reagent support trays stacked above the reagent support tray being disposed at a second side of the stack opposite the first side of the stack. As a result, gas flowing from below the bottom face of the support surface of the reagent support tray via the gas flow opening of the reagent support tray flows across the top face of the reagent support tray to reach the gas opening in the superjacent reagent support tray to flow from above the support surface of the reagent support tray to above the support surface of the superjacent reagent support tray According to other embodiments of the present disclosure, a particle suppression device is provided to suppress particles of predetermined sizes that may be generated by a source reagent material. The particle suppression device may be used in a vaporizer vessel that includes an outlet port and one or more reagent support trays to support the source reagent material. The particle suppression device includes a housing configured to be positioned between the one or more reagent support trays and the outlet port. The housing supports a plurality of parallel filters positioned separately in the housing. Portions of the gas mixture pass through one of the plurality of parallel filters to filter from the gas mixture particles of one or more predetermined sizes before the gas mixture reaches the outlet port Another aspect of the disclosure relates to a method of generating reagent vapor. The method includes providing source reagent material in a plurality of reagent support trays included in a stack of reagent support trays received in a vaporizer vessel. Each of the reagent support trays includes one or more gas flow openings adapted to redirect a flow of a gas so as to cause the flow of gas to interact with the source reagent material in a reagent support tray of the plurality of reagent support trays before passing into a superjacent support tray of the stack of reagent support trays. A flow of carrier gas is supplied into an inlet port of the vaporizer vessel such that the flow of carrier gas is released one of into or adjacent to the reagent support tray. Heat is applied to the vaporizer vessel to heat the source reagent material and gas within the vaporizer vessel, such that application of the heat motivates the gas within the vaporizer vessel to pass from the reagent support tray into the superjacent reagent support tray.

Another aspect of the disclosure relates to a method of filtering particles from reagent vapor generated in a vaporizer vessel. The method includes supplying a flow of carrier gas into an interior volume of the vaporizer vessel. A source reagent material is vaporized in one or more support trays in the interior volume of the vaporizer vessel to generate a reagent vapor. The reagent vapor comingles with the carrier gas to form a gas mixture of the reagent vapor, the carrier gas, and reagent particles generated by the source reagent material. Portions of the gas mixture are passed through a plurality of parallel filters separately arranged in a housing between the one or more support trays and an outlet of the vaporizer vessel to filter out particles among the reagent particles that exceed a predetermined size. The plurality of parallel filters enables filtering of the mixture of the reagent vapor and the carrier gas at a greater rate than achievable by using one of the plurality of parallel filters.

Other aspects, features and embodiments of the disclosure will be more fully apparent from the ensuing disclosure and appended claims.

BRIEF DESCRIPTION OF THE DRAWINGS

FIG. 1 is side cutaway view of a particular illustrative embodiment of a vaporizer vessel and associated components of the present disclosure adapted to redirect a flow of a gas mixture as it flows throughout the vaporizer vessel;

FIG. 2 is an exploded perspective view of another particular embodiment of a vaporizer vessel and associated components of the present disclosure;

FIG. 3 is perspective view of a particular illustrative embodiment of a reagent support tray according to the present disclosure using a plurality of channels, in the form of a plurality of bores through a divider, for conducting a flow of gas, where the reagent support tray of FIG. 3 has a first height;

FIG. 4 is perspective view of a particular illustrative embodiment of a reagent support tray according to the present disclosure using a plurality of channels, in the form of a plurality of bores through a divider, for conducting a flow of gas, where the reagent support tray of FIG. 4 has a second height that is greater than the first height of the reagent support tray of FIG. 3;

FIG. 5 is perspective view of a particular illustrative embodiment of a reagent support tray according to the present disclosure using a plurality of channels, in the form of a slot extending through each of a plurality of dividers for conducting a flow of gas, where the reagent support tray of FIG. 5 has a first height;

FIG. 6 is perspective view of a particular illustrative embodiment of a reagent support tray according to the present disclosure using a plurality of channels, in the form of a slot extending through each of a plurality of dividers for conducting a flow of gas, where the reagent support tray of FIG. 6 has a second height that is greater than the first height of the reagent support tray of FIG. 5;

FIG. 7 is perspective view of a particular illustrative embodiment of a reagent support tray similar to the reagent support tray of FIG. 3, except that the reagent support tray of FIG. 7 includes only dividers that extend fully across the support surface of the reagent support tray;

FIG. 8 is perspective view of a particular illustrative embodiment of a reagent support tray similar to the reagent support tray of FIG. 5, except that the reagent support tray of FIG. 7 includes only dividers that extend fully across the support surface of the reagent support tray;

FIG. 9 is a perspective view of a particular illustrative embodiment of a reagent support tray similar to the reagent support tray of FIG. 3, except that sides of the divider are not parallel in a plane of the support surface;

FIG. 10 is side cutaway view of another particular illustrative embodiment of a vaporizer vessel and associated components of the present disclosure adapted to redirect a flow of a gas mixture as it flows throughout the vaporizer vessel;

Figure 32:
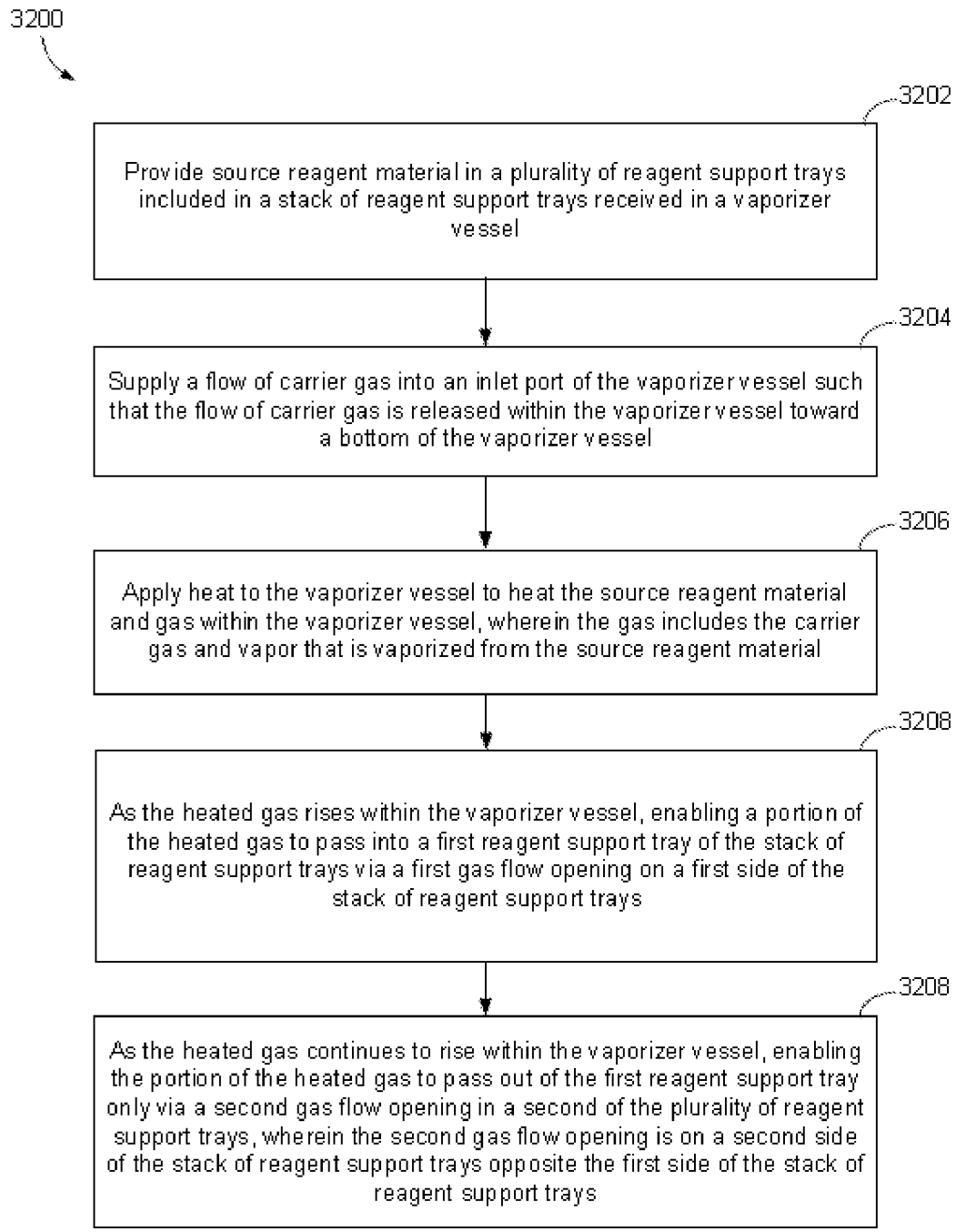
Figure 33:
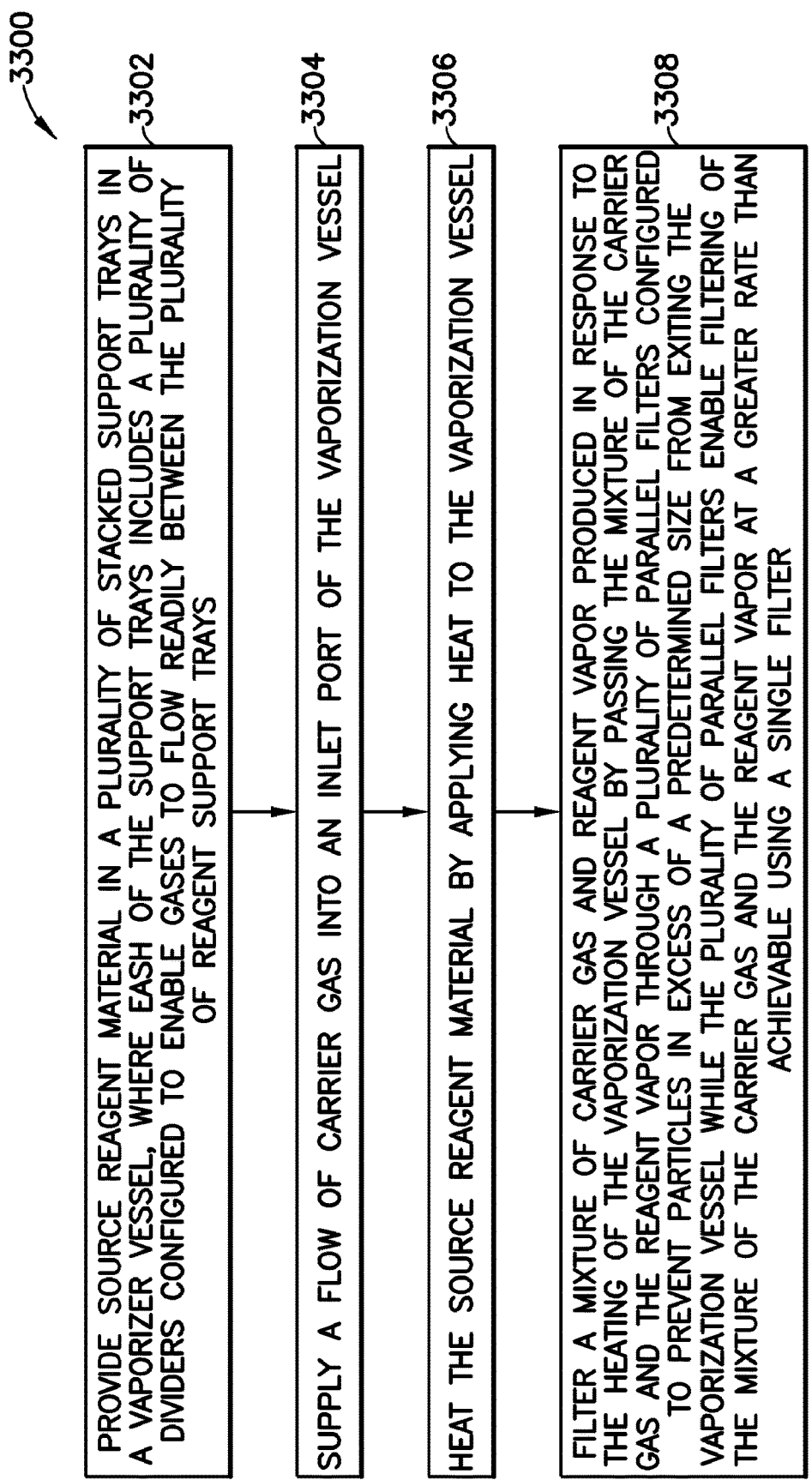

FIG. 32 is a flow diagram of another particular illustrative embodiment of a method for generating reagent vapor from reagent source material using embodiments of reagent support trays according to the present disclosure; and FIG. 33 is a flow diagram of a particular illustrative embodiment of a method for filtering particles from reagent vapor to be used in batch processing, such as deposition or implantation of materials, for a plurality of units according to the present disclosure.

DETAILED DESCRIPTION

The present disclosure relates to a vaporizer vessel apparatus, reagent support trays, particle suppression devices, methods for vaporization of source reagents, and other aspects of generating reagent vapors deposition or implantation of reagent materials. In a particular embodiment, the vaporizer vessel is configured to generate a large volume of reagent vapor to permit deposition and implantation of the reagent vapor for a batch of wafers or other objects, rather than for a single wafer or object.

According to the present disclosure, reagent support trays within a stack of reagent support trays for use in a vaporizer vessel include a plurality of gas flow openings. The gas flow openings may include channels in one or more dividers within a reagent support tray or may be positioned at one side of one or more of the reagent support trays. The channels in the dividers may be arranged to extend below a bottom face of particular reagent support tray to redirect a gas at the bottom face of the support tray to circulate away from the bottom face of the support tray before it can pass into a next reagent support tray. Alternatively, with side-disposed gas flow openings, a gas flowing into a reagent support tray at one side of a vaporizer vessel is redirected to flow across the reagent support tray (and reagent source material received therein) before passing out of the reagent support tray into a next reagent support tray via an opening disposed toward the other side of the vaporizer vessel.

Figure 1:
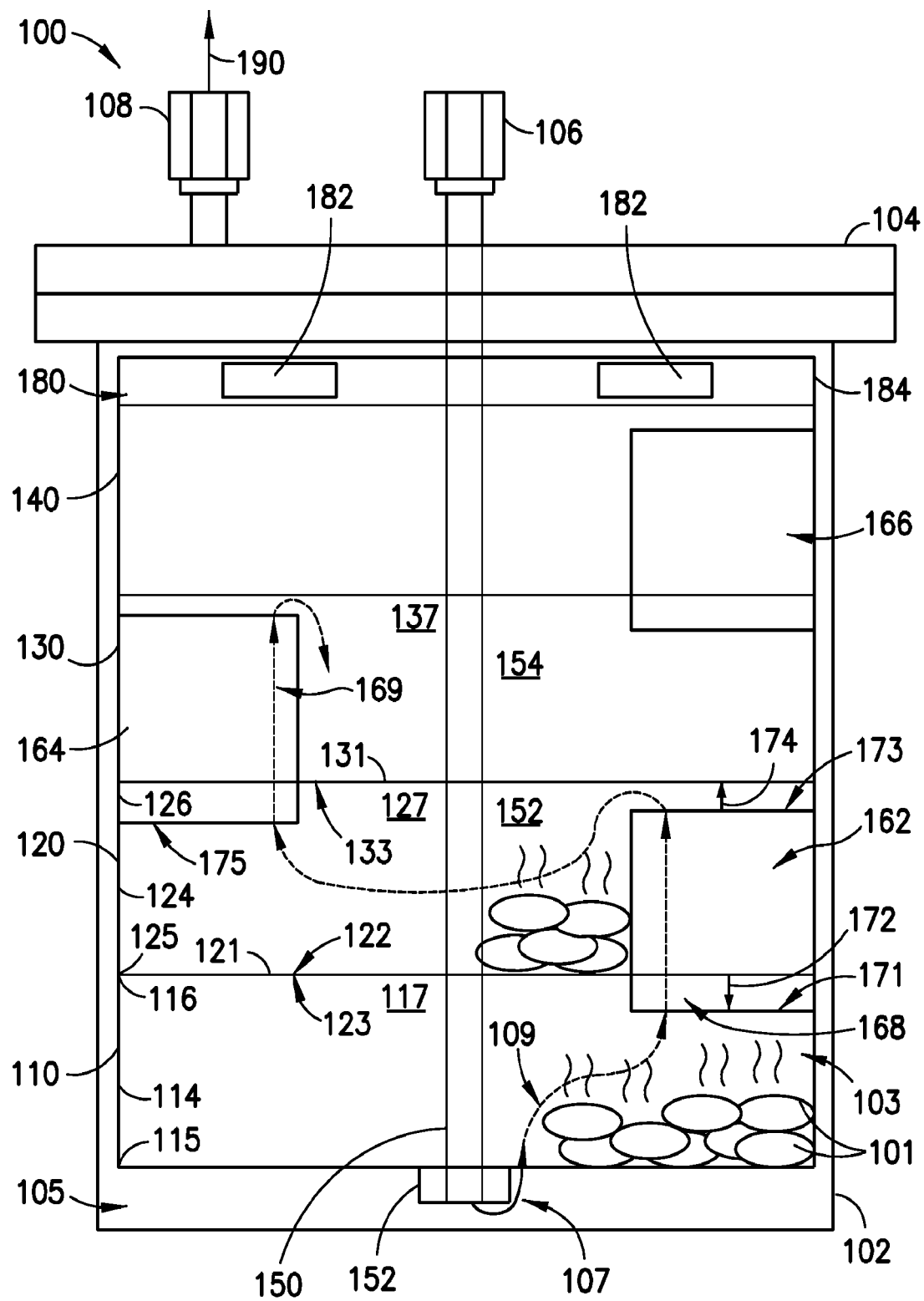

FIG. 1 is side cutaway view of a particular illustrative embodiment of a vaporizer vessel 100 and associated components according to the present disclosure. The vaporizer vessel 100 includes a body 102 and a lid 104. The lid 104 includes an inlet port 106 configured to receive a flow of a carrier gas (not shown in FIG. 1). The lid 104 also includes an outlet port 108 that may produce a mixture of carrier gas and reagent vapor (also not shown in FIG. 1). When the lid 104 is secured to the body 102, using clamps, bolts, or other devices, the body 102 and the lid 104 define an enclosed interior volume 105 of the vaporizer vessel 100.

In the particular illustrative embodiment of FIG. 1, a plurality of reagent support trays 110, 120, 130, and 140 of approximately equal size are received. The reagent support trays 110, 120, 130, and 140 are configured to receive a supply of a source reagent material 101 that is configured or expected to generate a reagent vapor 103.

The source reagent material 101 may include a solid source reagent material. Alternatively, another form of source reagent material (not shown) may be used, such as a liquid source reagent material (not shown) or a solid source reagent material dissolved in a solvent (also not shown). In a solid form, the source reagent material 101 may include a discontinuous form, including a number of separate units of solid source reagent material. Also, a solid source reagent material 101 may be in a powder form or a bead form, or may be in the form of a porous bulk article. For illustration, the source reagent material may include a number of compounds, including dimethyl hydrazine, trimethyl aluminum (TMA), hafnium chloride ($HfCl_4$), zirconium chloride ($ZrCl_4$), indium trichloride, aluminum trichloride, titanium iodide, tungsten carbonyl, $Ba(DPM)_2$, his di pivaloyl methanato strontium ($Sr(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide ($Zr(t-OBu)_4$), tetrakisdiethylaminozirconium ($Zr(Net_2)_4$), tetrakisdiethylaminohafnium ($Hf(Net_2)_4$), tetrakis (dimethylamino) titanium (TDMAT), tertbutyliminotris (deithylamino) tantalum (TBTDET), pentakis (demethylamino) tantalum (PDMAT), pentakis (ethylmethylamino) tantalum (PEMAT), tetrakisdimethylaminozirconium (Zr(NMe$_2$)$_4$), hafniumtertiarybutoxide (Hf(tOBu)$_4$), xenon difluoride (XeF$_2$), xenon tetrafluoride (XeF$_4$), xenon hexafluoride (XeF$_6$), and compatible combinations and mixtures of two or more of the foregoing.

Figure 2:
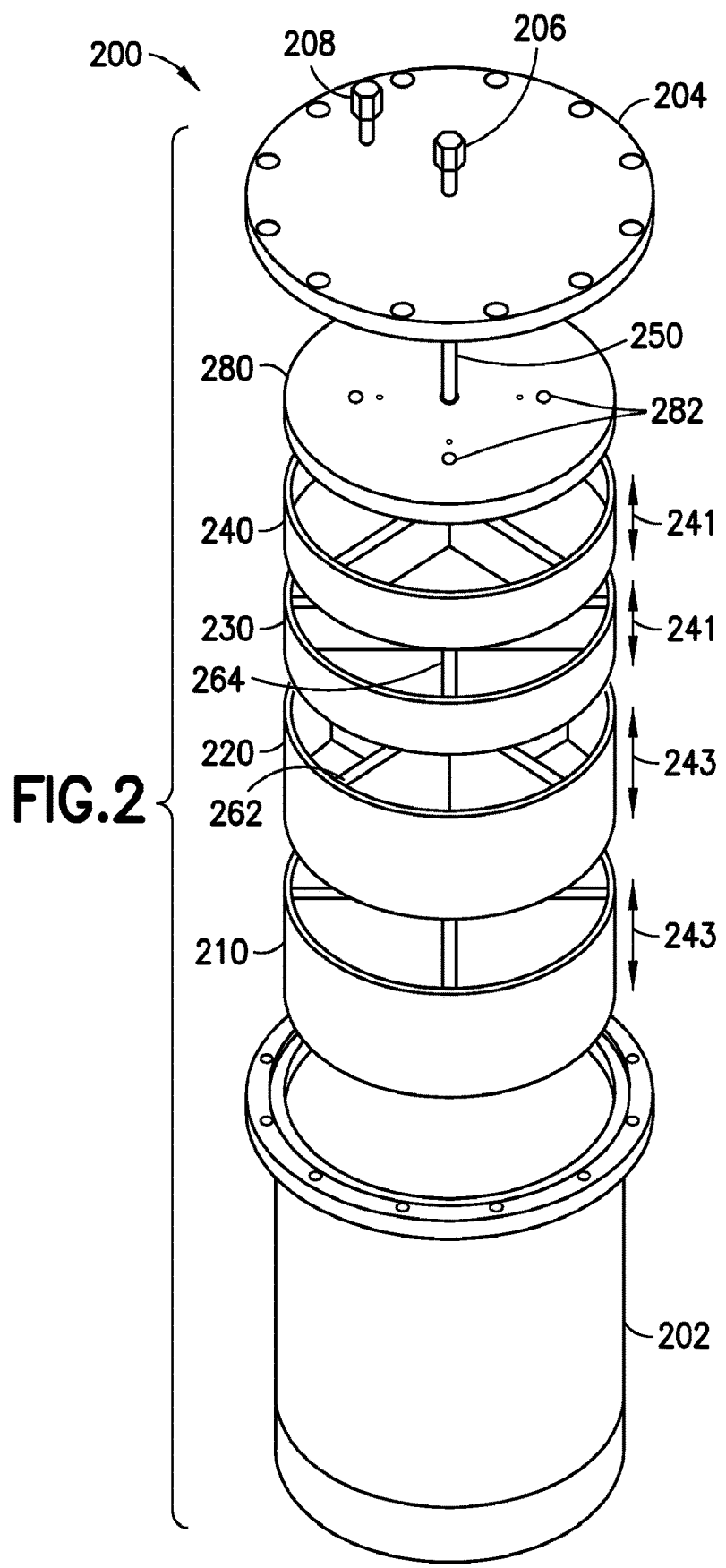

It should be understood, and as will be further explained with reference to FIG. 2, that each of the plurality of reagent support trays 110, 120, 130, and 140 may be of different sizes, as depicted in FIGS. 2-6. Further, although both FIGS. 1 and 2 depict that the plurality of reagent support trays 110, 120, 130, and 140 includes four individual reagent support trays, any number of reagent support trays may be used.

The reagent support trays 110, 120, 130, and 140 and the vaporizer vessel 100, may be comprised of a thermally conductive material to promote heating of the source reagent materials. The reagent support trays 110, 120, 130, and 140, for example, may be comprised of metal or another material that, desirably, is nonreactive with the carrier gas, the source reagent material, or the reagent vapor produced by vaporizing the source reagent material. For example, the reagent support trays 110, 120, 130, and 140 and/or the vaporizer vessel 100 may be comprised of a thermally conductive material including silver, silver alloy, copper, copper alloy, aluminum, aluminum alloy, lead, nickel clad, stainless steel, graphite, silicon carbide coated graphite, boron nitride, ceramic material, and combinations, mixtures and alloys of two or more of the preceding materials.

FIG. 1 also depicts the use of at least one particle suppression device 180 within the vaporizer vessel 100, wherein the particle suppression device 180 is positioned between the plurality of reagent support trays 110, 120, 130, and 140 and the outlet port 108. The mixture of carrier gas and reagent vapor therefore passes through the at least one particle suppression device 180 before being discharged from the vaporizer vessel 100 via the outlet port 108 to filter out particles in excess of a predetermined size that may be generated as part of the vaporization of the source reagent material. In a particular embodiment, the particle suppression device 180 includes a plurality of parallel filters 182 separately arranged in a housing 184. According to a particular embodiment, use of the plurality of separate filters 182 may enable the particle suppression device 180 to pass and filter a volume of the carrier gas and reagent vapor mixture at a rate greater than may permitted by a single filter (not shown in FIG. 1).

Figure 28:
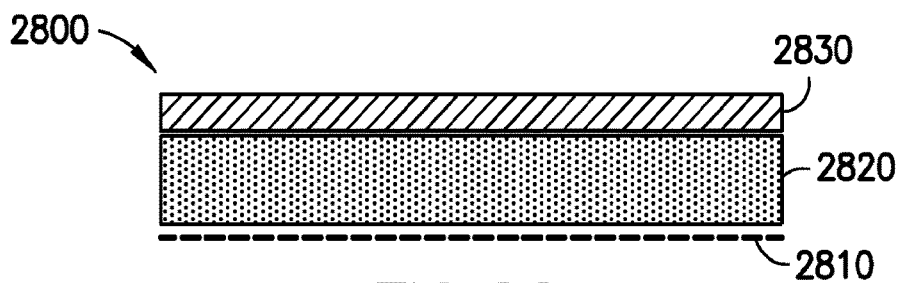
FIG. 28 is a cross-sectional view of a plurality of filter elements that may be included among multiple filter elements in the plurality of filters of FIG. 27.

In a particular illustrative embodiment, and as further described with reference to FIG. 28, each of the plurality of filters 182 may include multiple filter components coupled in series with one another to successively filter out particles of different sizes. For example, the plurality of filter components may include successive layers of filter material to suppress particles of successively smaller sizes. One or more of the plurality of filters 182 may include at least one frit configured to prevent the passage therethrough of a particle having a size greater than a predetermined acceptable size. Alternatively or additionally, one or more of the plurality of filters 182 may include a thermally conductive foam material, such as a metal foam material. The particle suppression device 180 also may include an electrostatic particle collector configured to remove particles from the mixture of carrier gas and source reagent vapor.

In operation, the vaporizer vessel 100, the plurality of reagent support trays 110, 120, 130, and 140, the source reagent material 101 and other components may be heated. A flow of carrier gas 107 may be introduced via the inlet port 106. In a particular embodiment, the flow of carrier gas 107 received via the inlet port 106 is conducted downward to a bottom of the enclosed interior volume 105 via a downtube 150. The downtube 150 enables the flow of carrier gas 107 to be introduced below a lowermost of the plurality of reagent support trays 110, 120, 130, and 140, thereby facilitating interaction of the flow of carrier gas 107 with contents of each of the plurality of reagent support trays 110, 120, 130, and 140 as the heated carrier gas expands and migrates upward toward the outlet port 108. The flow of carrier gas 107 also may be introduced through the downtube 150 to a flow disperser 152 to generate a vortex of the carrier gas to further promote interaction between the carrier gas and the source reagent material 101 within the plurality of reagent support trays 110, 120, 130, and 140. The carrier gas then interacts with the heated source reagent materials 101 to generate a gas mixture 109 of carrier gas 107, source reagent vapor 103, and, potentially, spurious particles (not shown in FIG. 1). Particles in excess of a predetermined size are filtered by the separate filters 182 of the particle suppression device 180, and the filtered mixture 190 of carrier gas and source reagent vapor exits the vaporizer vessel 100 via the outlet port 108.

In a particular embodiment, at least one of the plurality of reagent support trays 110, 120, 130, and 140 includes one or more dividers 162, 164, and 166 through each of which extend one or more channels 168 that convey the gas mixture 109 (or the flow of carrier gas 107 or the reagent vapor 103) from a volume above one of the plurality of reagent support trays 110, 120, 130, and 140 to a volume above another of the plurality of reagent support trays 110, 120, 130, and 140 such as a next reagent support tray stacked above the first of the support trays. The one or more dividers 162, 164, and 166 are configured to redirect the flow of the gas mixture 109 to promote engagement with the source reagent material 101 and/or the reagent vapor 103 to promote entrainment of the reagent vapor 103 within the gas mixture 109.

For purposes of further explanation of an embodiment of a configuration of the plurality of reagent support trays 110, 120, 130, and 140 as shown in FIG. 1, it is assumed that all of the reagent support trays in the plurality of reagent support trays 110, 120, 130, and 140 have the same dimensions and configurations. However, as specifically described below, the plurality of reagent support trays 110, 120, 130, and 140 of FIG. 1 having the same dimensions is assumed only for purposes of the example of FIG. 1. As expressly described below with reference to FIGS. 15-20, however, it may be desirable to include reagent support trays having different heights or other different dimensions in a stack of reagent support trays deployed within a vaporizer vessel.

The dividers 162, 164, and 166 also are assumed to have the same dimensions and configurations. As a result, a description of the configuration and/or operation of one of the plurality of the plurality of reagent support trays 110, 112, 114, and 116 and/or one of the plurality of dividers 162, 164, and is applicable to others of the plurality of reagent support trays 110, 120, 130, and 140 or others of the plurality of dividers 162, 164, and 166. Also, instead of including reference numbers for the same parts of each of the plurality of reagent support trays 110, 120, 130, and 140, for visual simplicity, elements of each of the plurality of reagent support trays 112, 114, and 116 that are described in referencing operation of the vaporizer 100 are labeled, but the corresponding elements of others of the plurality of reagent support trays 110, 120, 130, and 140 may not be labeled. It should be understood, however, that a reference to the configuration or operation of an element of one of the plurality of reagent support trays 110, 120, 130, and 140 is applicable to corresponding elements of others of the plurality of reagent support trays 110, 120, 130, and 140 that may not be individually labeled and described.

Also for purposes of further explanation of an embodiment of a configuration of the plurality of reagent support trays 110, 120, 130, and 140, the reagent support tray 120 will be referred to, simply, as the support tray 120, while the reagent support tray 110 that is stacked beneath the support tray 120 will be referred to as a subjacent support tray 110. Similarly, the reagent support tray 130 stacked above the support tray 120 will be referred to as the superjacent support tray 130. This nomenclature is used to differentiate relative positions of the reagent support trays 110, 120, and 130 within a vertical stack of the reagent support trays 110, 120, 130, and 140 in simplifying the following description. Also, although gases flowing within the vaporizer vessel 100 may include the flow of carrier gas 107, the reagent vapor 103, and the gas mixture 109, for simplicity of explanation, the flow of gases within the vaporizer vessel 100 will hereafter be referred to as the gas mixture 109.

The support tray 120 includes a support surface 121 having a top face 122 and a bottom face 123. The top face 122 is an upward-facing surface configured to support the source reagent material 101. The bottom face 123 is a downward-facing surface that may serve to contain a subjacent volume 117 between the support tray 120 and the subjacent support tray 110. In a particular embodiment, the subjacent volume 117, or other similar volumes, may be bounded by the support surfaces 111 and 121 of the respective support trays 110 and 120 and interior sidewalls 155 of the vaporizer vessel 100. Alternatively, the respective support trays 110 and 120 may include sidewalls 114 and 124 extending perpendicularly from peripheries of the respective support trays 110 and 120 to contain volumes above each of the respective support trays 110 and 120, such as the subjacent volume 117 above the subjacent support tray 110. The respective sidewalls 114 and 124 may extend from lower edges 115 and 125 to upper edges 125 and 126 such that, for example, the lower edge 125 of the support tray 120 engages the upper edge 116 of the subjacent support tray 110 to enclose the subjacent volume 117 above the subjacent support tray 110. A gasket (not shown in FIG. 1) may be used to provide a seal between, for example, edges 116 and 125, to further seal the subjacent volume 117. Similarly, corresponding elements of the support tray 120 and the superjacent support tray 130 may be configured to contain a volume 127 above the support tray 120, and so on for each of the plurality of reagent support trays 110, 120, 130, and 140.

The divider 162 extends through the support surface 121 of the support tray 120, extending beneath the bottom face 123 of the support surface 121 to a lower end 171 a first distance 172 beneath the bottom face 123 of the support surface 121. The divider 162 also has an upper end 173 that extends to within a second distance 174 of a bottom face 133 of the superjacent support surface 131 of the superjacent support tray 130. A channel, such as the channel 168, extends between the lower end 171 and the upper end 173 of the divider 162 to convey the gas mixture 109 from the subjacent volume 117 above the subjacent support tray 110 to a volume 127 above the support tray 120. Similarly, a channel (not shown) in the divider 164 may convey the gas mixture 109 from the volume 127 above the support tray 120 to a superjacent volume 137 above the superjacent support tray 130, and so on.

In a particular embodiment, the lower end 171 of the divider 162 extends the first distance 172 below the bottom face 121 of the support tray 120. The upper end 173 of the divider 162, by contrast, extends to within the second distance 174 of the bottom face 133 of the superjacent support surface 131 of the superjacent support tray 130. The first distance 172 is greater than the second distance 174. Thus, in other words, a flow of the gas mixture 109 exiting the channel 168 at the upper end 173 of the divider 162 of the support tray 120 is closer to the bottom face 133 of the superjacent support surface 131 of the superjacent support tray 130 than it is to the lower end 175 of the divider 164 of the superjacent support tray 130. As a result, as shown in FIG. 1, a flow of the gas mixture 109 that passes out of the channel 168 of the divider 162 of the support tray 120 would be forced to circulate away from the bottom face 133 of the superjacent support surface 131 of the superjacent support tray 130 before the flow of the gas mixture 109 can flow into the channel 169 at the lower end 175 of the divider 164 of the superjacent support tray 114. Thus, as the flow of the gas mixture 109 passes from the at the upper end 173 of the divider 162, toward the bottom face 133 of the superjacent support surface 131 of the superjacent support tray 130, the gas mixture 109 will be redirected to circulate toward the source reagent material 101 and through the source reagent vapor 103 to promote entrainment of the source reagent vapor 103 into the gas mixture 109. This tortuous flow path of the gas mixture is repeated as the gas mixture 109 flows between and into the volumes bounded by each of the plurality of reagent support trays 110, 120, 130, and 140.

The foregoing description of FIG. 1 exemplifies a mode of operation in which carrier gas introduced via the inlet port 106 flows downwardly in the downtube 150 and is discharged at a lower end thereof. The carrier gas thus discharged flows outwardly and upwardly through the pores and passages associated with the reagent support trays, and thereafter is discharged from the vaporizer vessel via the outlet port 108.

In another, "reverse flow" mode, the vaporizer vessel is arranged with respect to carrier gas flow so that the inlet port 106 previously described is instead utilized as the outlet port of the vessel, and with the outlet port 108 previously described being instead utilized as the inlet port of the vessel. A source of carrier gas (not shown in FIG. 1) thus is coupled in gas feed relationship with the (now inlet) port 108. In such configuration, the particle suppression device 180 may be removed from the vaporizer structure, or otherwise modified in structure and/or position, to accommodate the reverse flow mode of operation. The carrier gas thus introduced will then enter at the top of the vaporizer vessel and flow outwardly and downwardly through the pores and passages associated with the reagent support trays and then upwardly through the tube 150 (which in such reverse mode becomes an uptube) so that the carrier gas containing volatilized source reagent material entrain therein is discharged from the vaporizer vessel through (now outlet) port 106.

It will be recognized that such reverse flow mode may be utilized in any of the vaporizer structures of the present disclosure, and may be advantageous in specific implementations to achieve enhancement in saturation of the source reagent material in the carrier gas mixture discharged from the vaporizer vessel.

FIG. 2 is an exploded perspective view of another particular embodiment of a vaporizer vessel 200 and associated components according to the present disclosure. The vaporizer vessel 200 of FIG. 2 includes a number of the same components which are identified by similar reference numbers.

The vaporizer vessel 200 includes a body 202 and a lid 204. The lid 204 includes an inlet port 206 configured to receive a flow of a carrier gas (not shown in FIG. 2). The inlet port 206 is coupled to a downtube 250 to convey the flow of carrier gas to the lowermost portion of the vaporizer vessel 200, as described with reference to FIG. 1. The lid 204 also includes an outlet port 208 that may produce a mixture of carrier gas and reagent vapor (also not shown in FIG. 2). When the components of the vaporizer vessel 200 are assembled, and the lid 204 is secured to the body 202 using clamps, bolts, or other devices, the body 202 and the lid 204 define an enclosed interior volume (not shown in FIG. 2) of the vaporizer vessel 200, as described with reference to FIG. 1.

The vaporizer vessel 200 of FIG. 2, like the vaporizer vessel 100 of FIG. 1, receives a total of four reagent support trays 210, 220, 230, and 240. Although both FIGS. 1 and 2 depict the use of four reagent support trays, embodiments according to the present disclosure are not limited to using a particular number of reagent support trays that may be received within a particular vaporizer vessel 100 (FIG. 1) or 200 (FIG. 2).

In contrast to the embodiment illustrated in FIG. 1, FIG. 2 shows that a plurality of reagent support trays 210, 220, 230, and 240 received within the vaporizer vessel 200 may be of different dimensions. Specifically, reagent support trays 210 and 220, which are positioned at a lowermost end of a stack of the plurality of reagent support trays 210, 220, 230, and 240 in the example of FIG. 2, have a first depth 241 that is greater than a second depth 243 of reagent support trays 230 and 240. Moreover, although the plurality of reagent support trays 210, 220, 230, and 240 are depicted as having two different depths 241 and 243, the plurality of reagent support trays 211-214 may have as many different depths as there are reagent support trays.

As described further with reference to FIGS. 3-6, one or more of the plurality of reagent support trays 210, 220, 230, and 240 may include dividers, such as dividers 262 and 264 of reagent support trays 220 and 230, respectively, through which channels exist to facilitate the flow of gas between the plurality of reagent support trays 210, 220, 230, and 240 within the vaporizer vessel 200. To facilitate the flow of gas among source reagent materials (not shown in FIG. 2) that may be received within the plurality of reagent support trays 210, 220, 230, and 240, the plurality of reagent support trays 210, 220, 230, and 240 may be aligned at a relative angular offset to one another. In other words, the plurality of reagent support trays 210, 220, 230, and 240 may be positioned so that the dividers, such as dividers 262 and 264, are not in vertical alignment. As a result, for example, gas flowing through a channel in the divider 262 of the regent support tray 220 may flow over source reagent materials received in the reagent support tray 220 before reaching a channel in the divider 264 of the reagent support tray 230 enabling the gas to flow upward to the next reagent support tray 230. The offset angular positioning of the dividers of the plurality of reagent support trays 210, 220, 230, and 240 thus may facilitate the interaction of gasses in the vaporizer vessel 200 with source reagent materials contained in the plurality of reagent support trays 210, 220, 230, and 240.

FIG. 2 also depicts the use of at least one particle suppression device 280 within the vaporizer vessel 200. As in the example of FIG. 1, the particle suppression device 280 is positioned between the plurality of reagent support trays 210, 220, 230, and 240 and the outlet port 208. The mixture of carrier gas and reagent vapor passing through the plurality of reagent support trays 210, 220, 230, and 240 therefore passes through the at least one particle suppression device 280 before being discharged from the vaporizer vessel 200 via the outlet port 208. Passage through the particle suppression device 280 filters out particles in excess of a predetermined size that may be generated as part of the vaporization of the source reagent material. In a particular embodiment, the particle suppression device 280 includes a plurality of separate filters 282, the egress points of which are depicted in FIG. 2. The particle suppression device 280 is further described below with reference to FIGS. 7, 8, and 9.

Figure 3:
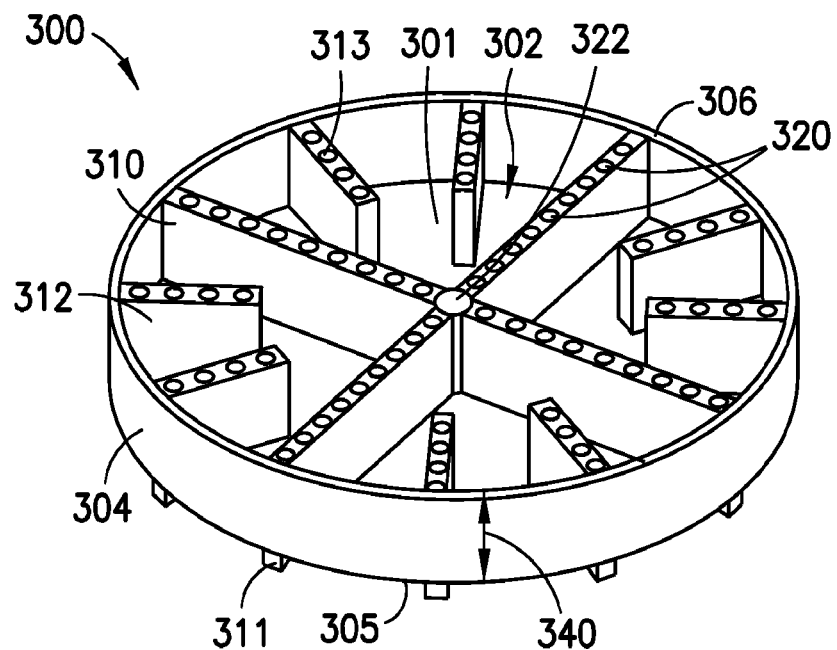

FIG. 3 is perspective view of a particular illustrative embodiment of a reagent support tray 300 according to the present disclosure. As previously described with reference to FIG. 1, the reagent support tray 300 includes a plurality of dividers 310 and 312 through which extend channels 320 to conduct a flow of gas mixture or other gases between volumes bounded by reagent support trays.

The reagent support tray 300 includes a reagent support surface 301 having a top face 302 that serves as a bottom of the reagent support tray 300. The reagent support surface 301 supports source reagent material (not shown in FIG. 3) placed in the reagent support tray 300. The reagent support tray 300 is bounded by a sidewall 304 extending around a periphery of the support surface 301 to contain reagent source material placed on the reagent support surface 301. A top edge 306 of the sidewall 304 may also be regarded as the top edge of the reagent support tray 300. Correspondingly, a bottom edge 305 of the reagent support surface 301 may be regarded as a bottom edge of the reagent support tray 300 (of lower ends of the dividers 310 and 312, such as lower end 311 may be regarded as a bottom edge of the reagent support tray 300, as further described below). A height 340 of the reagent support tray 300 (which may be measured internally or externally, as shown in FIG. 3) extends from the bottom edge 305 of the reagent support tray 300 to the top edge 306 of the reagent support tray 300.

In a particular embodiment, a volume encompassed by the reagent support tray 300 is divided by the plurality of dividers 310 and 312. As previously described with reference to FIG. 1, the plurality of dividers 310 and 312 extend vertically through the support surface 301 from a lower end 311 to an upper end 313, with a plurality of channels 320 extending between the lower end 311 and the upper end 313 of each of the plurality of dividers 310 and 312. In the embodiment of FIG. 3, the plurality of channels 320 includes a plurality of generally parallel bores 320 extending through the dividers 310 and 312.

One or more of the plurality of dividers, such as divider 310, may extend fully across the support surface 301. In a particular embodiment, to receive a downtube (150 and 250 as shown in FIGS. 1 and 2, respectively), the divider 310 may include an opening 322 through which the downtube may extend through the reagent support tray 300. One or more others of the plurality of dividers, such as the divider 312, may extend only partially across the support surface 301. In the embodiment of FIG. 3, both types of dividers 310 and 312 include a plurality of channels 320 extending therethrough.

As previously explained with reference to FIG. 1, in a particular embodiment, the plurality of dividers 310 and 312 extend downwardly to a lower end 311 beneath the support surface 301 and extend upwardly to an upper end 313. The relative lengths to which the lower ends 311 and upper ends extend 313 is configured to promote circulation of a gas mixture through a volume bounded by the reagent support tray 300 before passing out of that volume, as described with reference to FIG. 1.

By way of example, the reagent support tray 300 may have a diameter of 8.9 inches, a height of 1.18 inches as measured from a bottom of the support surface to an upper edge of the sidewall, and a height of 1.456 inches as measured from a lower end of the dividers to the upper edge of the sidewall. The dividers may have a width of 0.28 inches, and the dividers may include a total of 52 channels, as shown in FIG. 3. A surface area of the support surface may be 49.68 square inches, providing a 75% fillable volume of 36.515 cubic inches and, in a particular embodiment, a fill weight of 300 grams. These dimensions and capacities enable generation of a sufficient quantity of source reagent vapor for deposition or implantation of source material in, for example, a batch of semiconductor wafers. (By comparison, an exemplary support tray for a single wafer application may provide a surface area of 7.99 square inches and accommodate a 75% fillable weight of 28 grams.) A vaporizer vessel of a proportional diameter may be used to accommodate such support trays. A height of the vaporizer vessel may be selected to accommodate a stack of reagent support trays including a desired number of reagent support trays.

Figure 4:
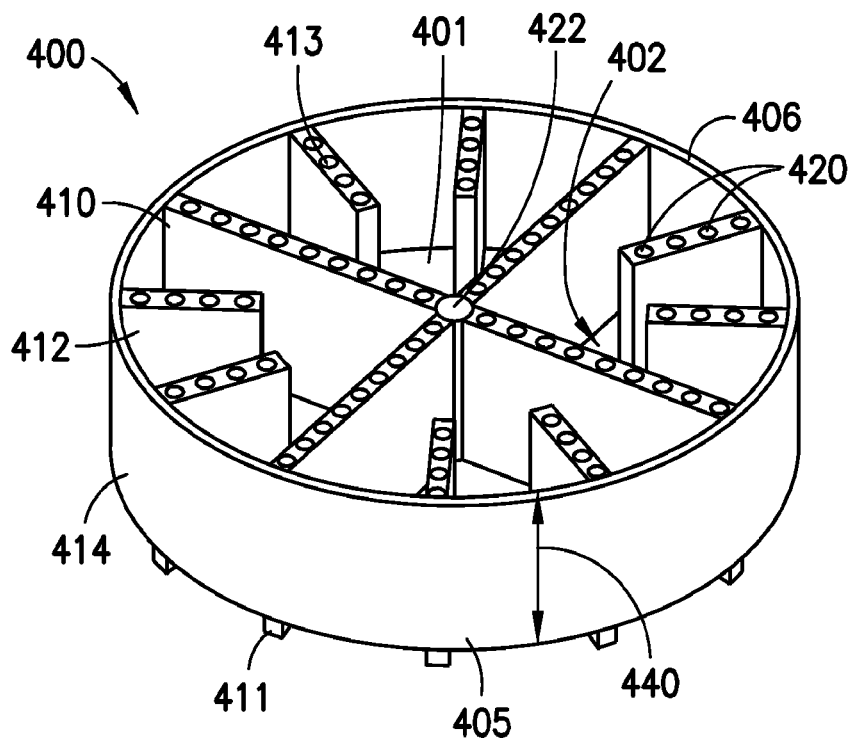

FIG. 4 is perspective view of a particular illustrative embodiment of a reagent support tray 400 according to the present disclosure. The reagent support tray 400 of FIG. 4 is similar to the reagent support tray 300 of FIG. 3, except that the reagent support tray 400 of FIG. 4 has a different height 440 than the height of the reagent support tray 300.

As previously described with reference to FIG. 1, the reagent support tray 400 includes a plurality of dividers 410 and 412 through which extend channels 420 to conduct a flow of gas mixture or other gases between volumes bounded by reagent support trays.

The reagent support tray 400 includes a reagent support surface 401 having a top face 402 that serves as a bottom of the reagent support tray 400. The reagent support surface 401 supports source reagent material (not shown in FIG. 4) placed in the reagent support tray 400. The reagent support tray 400 is bounded by a sidewall 404 extending around a periphery of the support surface 401 to contain reagent source material placed on the reagent support surface 401. A top edge 406 of the sidewall 404 may also be regarded as the top edge of the reagent support tray 400. Correspondingly, a bottom edge 405 of the reagent support surface 401 may be regarded as a bottom edge of the reagent support tray 400 (of lower ends of the dividers 410 and 412, such as lower end 411 may be regarded as a bottom edge of the reagent support tray 400, as further described below). A height 440 of the reagent support tray 400 (which may be measured internally or externally, as shown in FIG. 4) extends from the bottom edge 405 of the reagent support tray 400 to the top edge 406 of the reagent support tray 400.

In a particular embodiment, a volume encompassed by the reagent support tray 400 is divided by the plurality of dividers 410 and 412. As previously described with reference to FIG. 1, the plurality of dividers 410 and 412 extend vertically through the support surface 401 from a lower end 411 to an upper end 413, with a plurality of channels 420 extending between the lower end 411 and the upper end 413 of each of the plurality of dividers 410 and 412.

One or more of the plurality of dividers, such as divider 410, may extend fully across the support surface 401. In a particular embodiment, to receive a downtube (150 and 250 as shown in FIGS. 1 and 2, respectively), the divider 410 may include an opening 422 through which a downtube may extend through the reagent support tray 400. One or more others of the plurality of dividers, such as the divider 412, may extend only partially across the support surface 401. In the embodiment of FIG. 4, both types of dividers 410 and 412 include a plurality of channels 420 extending therethrough. In the embodiment of FIG. 4, the plurality of channels 420 includes a plurality of generally parallel bores 420 extending through the dividers 412 and 414.

As previously explained with reference to FIG. 1, in a particular embodiment, the plurality of dividers 410 and 412 extend downwardly to a lower end 411 beneath the support surface 401 and extend upwardly to an upper end 413. The relative lengths to which the lower ends 411 and upper ends extend 413 is configured to promote circulation of a gas mixture through a volume bounded by the reagent support tray 400 before passing out of that volume, as described with reference to FIG. 1.

As previously described with reference to FIG. 2, reagent support trays of different heights may be used, and reagent support trays of different heights may be used within a vaporizer vessel at the same time. For the sake of example, the height 340 of the reagent support tray of FIG. 3 may be 1.18 inches as measured from the bottom edge 305 of the support surface 301 to the top edge 306 of the reagent support tray 300. The lower end of the dividers 310 and 312 may extend beneath the support surface 301 to a first distance of 0.276 inches. By contrast, the height 440 of the reagent support tray 400 may be 2.36 inches as measured from the bottom edge 405 of the support surface 401 to the top edge 406 of the reagent support tray 400. The lower end of the dividers 410 and 412 may also extend beneath the support surface 401 to a first distance of 0.276 inches.

By way of example, the reagent support tray 400 may have a diameter of 8.9 inches, a height of 1.26 inches as measured from a bottom of the support surface to an upper edge of the sidewall, and a height of 2.636 inches as measured from a lower end of the dividers to the upper edge of the sidewall. The dividers may have a width of 0.28 inches, and the dividers may include a total of 68 channels, as shown in FIG. 4. A surface area of the support surface may be 49.68 square inches, providing a 75% fillable volume of 80.483 cubic inches and, in a particular embodiment, a fill weight of 660 grams. These dimensions and capacities enable generation of a sufficient quantity of source reagent vapor for deposition or implantation of source material in, for example, a batch of semiconductor wafers.

Figure 5:
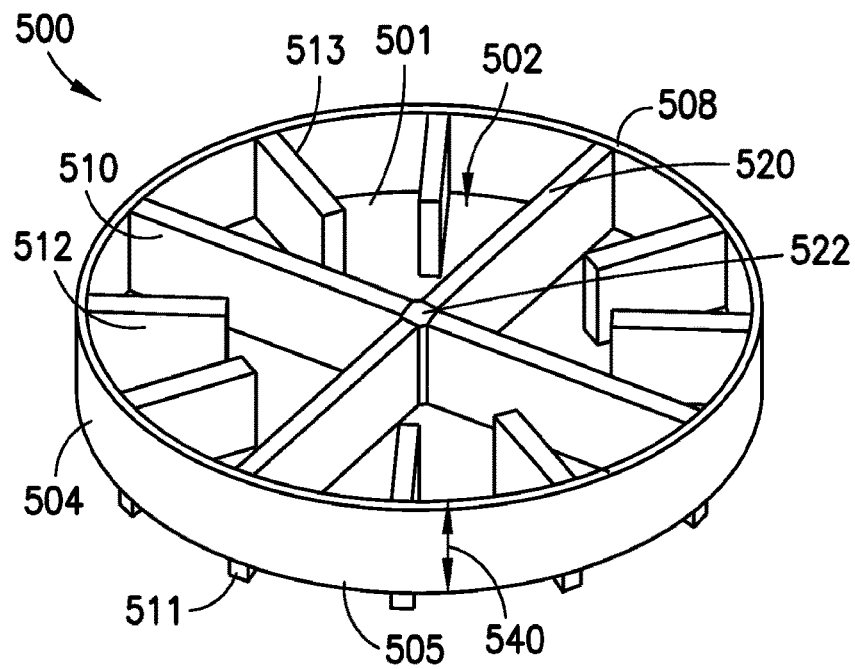
Figure 6:
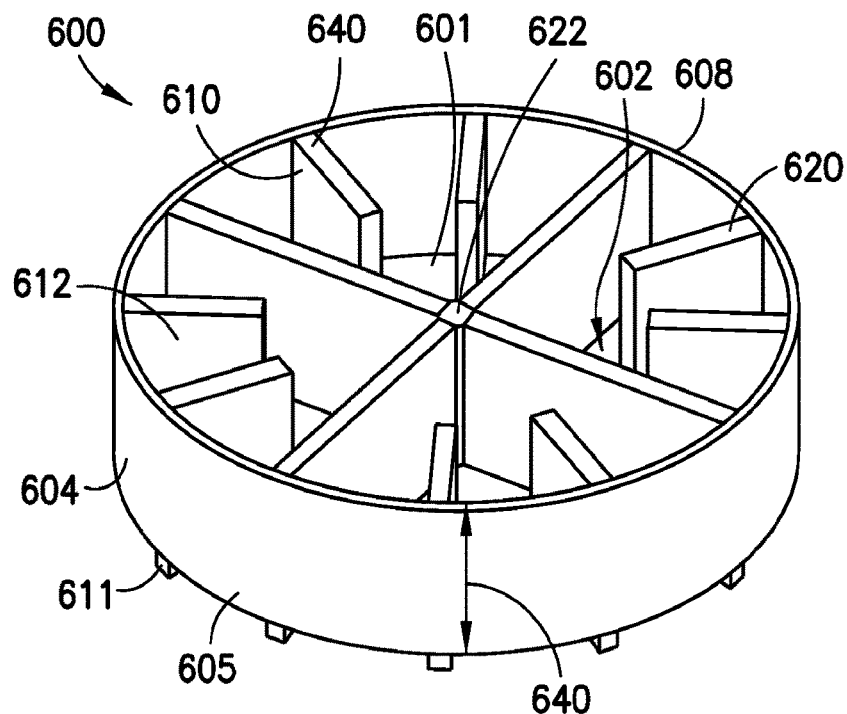

FIG. 5 is perspective view of a particular illustrative embodiment of a reagent support tray 500 according to the present disclosure. The reagent support tray 500 of FIG. 5 and the reagent support tray 600 of FIG. 6 are similar to the reagent support trays 300 and 400 of FIGS. 3 and 4, respectively. However, as further described below, the support trays 500 and 600 have different types of channels than are included in the in the reagent support trays 300 and 400.

As previously described with reference to FIG. 1, the reagent support tray 500 includes a plurality of dividers 510 and 512 through which extend channels 520 to conduct a flow of gas mixture or other gases between volumes bounded by reagent support trays.

The reagent support tray 500 includes a reagent support surface 501 having a top face 502 that serves as a bottom of the reagent support tray 500. The reagent support surface 501 supports source reagent material (not shown in FIG. 5) placed in the reagent support tray 500. The reagent support tray 500 is bounded by a sidewall 504 extending around a periphery of the support surface 501 to contain reagent source material placed on the reagent support surface 501. A top edge 506 of the sidewall 504 may also be regarded as the top edge of the reagent support tray 500. Correspondingly, a bottom edge 505 of the reagent support surface 501 may be regarded as a bottom edge of the reagent support tray 500 (of lower ends of the dividers 510 and 512, such as lower end 511 may be regarded as a bottom edge of the reagent support tray 500, as further described below). A height 540 of the reagent support tray 500 (which may be measured internally or externally, as shown in FIG. 5) extends from the bottom edge 505 of the reagent support tray 500 to the top edge 506 of the reagent support tray 500.

In a particular embodiment, a volume encompassed by the reagent support tray 500 is divided by the plurality of dividers 510 and 512. As previously described with reference to FIG. 1, the plurality of dividers 510 and 512 extend vertically through the support surface 501 from a lower end 511 to an upper end 513, with a plurality of channels 520 extending between the lower end 511 and the upper end 513 of each of the plurality of dividers 510 and 512. In the embodiment of FIG. 5, both types of dividers 510 and 512 include a plurality of channels 520 extending through the dividers 510 and 512. In the embodiment of FIG. 5, the plurality of channels 520 includes a hollow slot 520 extending through the dividers 510 and 512.

One or more of the plurality of dividers, such as divider 510, may extend fully across the support surface 501. In a particular embodiment, to receive a downtube (150 and 250 as shown in FIGS. 1 and 2, respectively), the divider 510 may include an orifice 522 to receive a downtube and through which the downtube may extend through the reagent support tray 500. One or more others of the plurality of dividers, such as the divider 512, may extend only partially across the support surface 501. As previously explained with reference to FIG. 1, in a particular embodiment, the plurality of dividers 510 and 512 extend downwardly to a lower end 511 beneath the support surface 501 and extend upwardly to an upper end 513. The relative lengths to which the lower ends 511 and upper ends extend 513 are selected and configured to promote circulation of a gas mixture through a volume bounded by the reagent support tray 500 before passing out of that volume, as described with reference to FIG. 1.

FIG. 6 is perspective view of a particular illustrative embodiment of a reagent support tray 600 according to the present disclosure. As previously described with reference to FIG. 1, the reagent support tray 600 includes a plurality of dividers 610 and 612 through which extend channels 620 to conduct a flow of gas mixture or other gases between volumes bounded by reagent support trays.

The reagent support tray 600 includes a reagent support surface 601 having a top face 602 that serves as a bottom of the reagent support tray 600. The reagent support surface 601 supports source reagent material (not shown in FIG. 6) placed in the reagent support tray 600. The reagent support tray 600 is bounded by a sidewall 604 extending around a periphery of the support surface 601 to contain reagent source material placed on the reagent support surface 601. A top edge 606 of the sidewall 604 may also be regarded as the top edge of the reagent support tray 600. Correspondingly, a bottom edge 605 of the reagent support surface 601 may be regarded as a bottom edge of the reagent support tray 600 (of lower ends of the dividers 610 and 612, such as lower end 611 may be regarded as a bottom edge of the reagent support tray 600, as further described below). A height 640 of the reagent support tray 600 (which may be measured internally or externally, as shown in FIG. 6) extends from the bottom edge 605 of the reagent support tray 600 to the top edge 606 of the reagent support tray 600.

In a particular embodiment, a volume encompassed by the reagent support tray 600 is divided by the plurality of dividers 610 and 612. As previously described with reference to FIG. 1, the plurality of dividers 610 and 612 extend vertically through the support surface 601 from a lower end 611 to an upper end 613, with a plurality of channels 620 extending between the lower end 611 and the upper end 613 of each of the plurality of dividers 610 and 612. As in the embodiment of FIG. 5, in the embodiment of FIG. 6, each of the plurality of channels 620 includes a hollow slot 620 extending through the divider 610 or 612.

One or more of the plurality of dividers, such as divider 610, may extend fully across the support surface 601. In a particular embodiment, to receive a downtube (150 and 250 as shown in FIGS. 1 and 2, respectively), the divider 610 may include an orifice 622 to engage the downtube and through which the downtube may extend through the reagent support tray 600. One or more others of the plurality of dividers, such as the divider 612, may extend only partially across the support surface 601. In the embodiment of FIG. 6, both types of dividers 610 and 612 include channels 620 extending therethrough.

As previously explained with reference to FIG. 1, in a particular embodiment, the plurality of dividers 610 and 612 extend downwardly to a lower end 611 beneath the support surface 601 and extend upwardly to an upper end 613. The relative lengths to which the lower ends 611 and upper ends extend 613 are selected and configured to promote circulation of a gas mixture through a volume bounded by the reagent support tray 600 before passing out of that volume, as described with reference to FIG. 1.

As previously described with reference to FIG. 2, reagent support trays of different heights may be used. Moreover, reagent support trays of different heights may be used within a vaporizer vessel at the same time. For the sake of example, the height 540 of the reagent support tray of FIG. 5 may be 1.18 inches as measured from the bottom edge 505 of the support surface 501 to the top edge 506 of the reagent support tray 500. The lower end of the dividers 510 and 512 may extend beneath the support surface 501 to a first distance of 0.276 inches. By contrast, the height 640 of the reagent support tray 600 may be 2.36 inches as measured from the bottom edge 605 of the support surface 601 to the top edge 606 of the reagent support tray 600. The lower end of the dividers 610 and 612 may also extend beneath the support surface 601 to a first distance of 0.276 inches.

Figure 7:
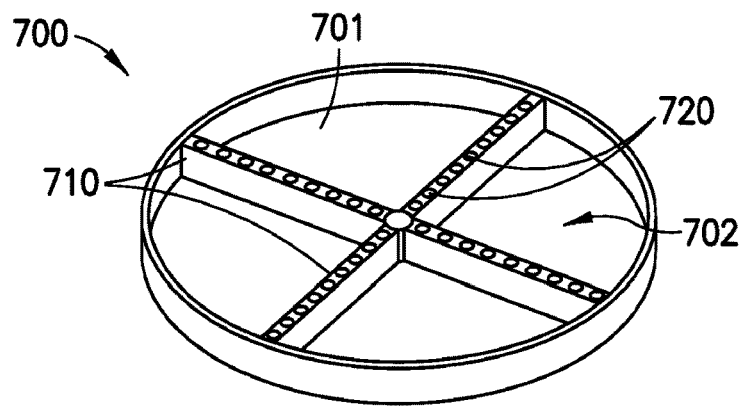
Figure 8:
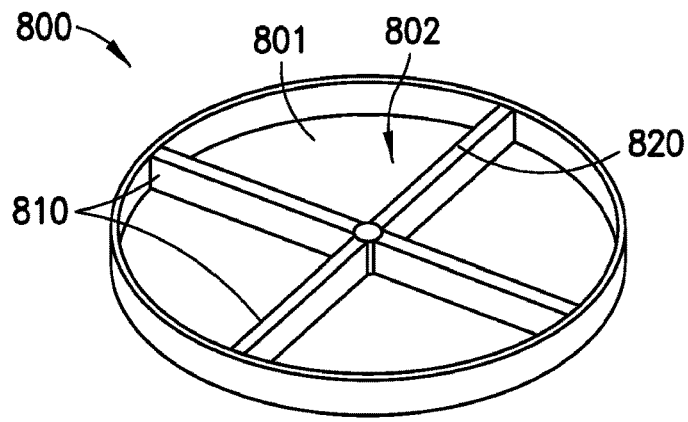

FIGS. 7 and 8 depict reagent support trays 700 and 800 that are similar to reagent support trays 300 of FIGS. 3 and 500 of FIG. 5, respectively. Referring to FIG. 7, the reagent support tray 700 includes a reagent support surface 701 having a top face 702 that serves as a bottom of the reagent support tray 700. The reagent support surface 701 supports source reagent material (not shown in FIG. 7) placed in the reagent support tray 700. The reagent support tray 700 is divided into sections by a plurality of dividers 710, each of which includes a plurality of generally parallel bores 720 extending through the dividers 710.

A difference between the reagent support tray 700 and the reagent support tray 300 of FIG. 3 is that the reagent support tray 700 includes only dividers that extend fully across the reagent support surface 701. In other word, in contrast to the reagent support tray 300 of FIG. 3 which includes a plurality of dividers 312 that extend only partially across the support surface 301, all of the dividers 710 of the reagent support tray 700 extend fully across the support surface 701. Thus, the regent support tray 700 includes more surface area on the support surface 701 as contrasted with the support surface 301 of the reagent support tray 300 of FIG. 3. Correspondingly, without the partial dividers 312 of the reagent support tray 300, the reagent support tray 700 includes fewer channels (in the form of the bores 720) to enable the passage of gas into the volume described by the reagent support tray 700.

Referring to FIG. 8, the reagent support tray 800 includes a reagent support surface 801 having a top face 802 that serves as a bottom of the reagent support tray 800. The reagent support surface 801 supports source reagent material (not shown in FIG. 8) placed in the reagent support tray 800. The reagent support tray 800 is divided into sections by a plurality of dividers 810, each of which includes a hollow slot 820 extending through the divider 810.

A difference between the reagent support tray 800 and the reagent support tray 500 of FIG. 5 is that the reagent support tray 800 includes only dividers that extend fully across the reagent support surface 801. In other word, in contrast to the reagent support tray 500 of FIG. 5 which includes a plurality of dividers 512 that extend only partially across the support surface 501, all of the dividers 810 of the reagent support tray 800 extend fully across the support surface 701. Thus, the regent support tray 700 includes more surface area on the support surface 801 as contrasted with the support surface 501 of the reagent support tray 500 of FIG. 5. Correspondingly, without the partial dividers 512 of the reagent support tray 500, the reagent support tray 800 includes fewer channels (in the form of the slots 820) to enable the passage of gas into the volume described by the reagent support tray 800.

Figure 9:
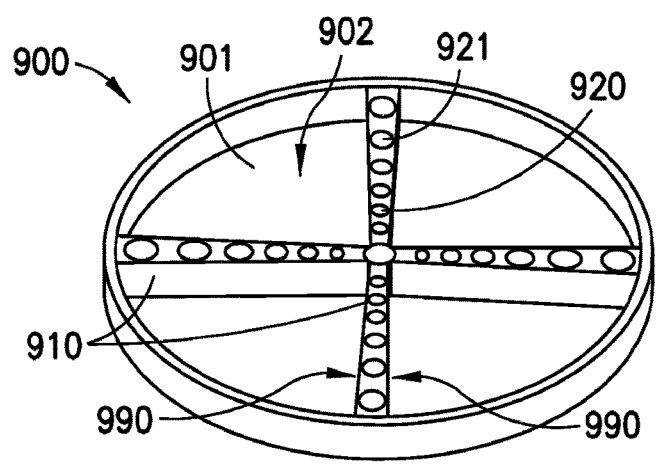

FIG. 9 is a perspective view of a particular illustrative embodiment of a reagent support tray 900 similar to the reagent support tray 700 of FIG. 7. The reagent support tray 900 includes a reagent support surface 901 having a top face 902 that serves as a bottom of the reagent support tray 900. The reagent support surface 901 supports source reagent material (not shown in FIG. 9) placed in the reagent support tray 900. The reagent support tray 900 is divided into sections by a plurality of dividers 910, each of which includes a plurality of bores 920 and 921 extending through the divider 910. A difference between the reagent support tray 900 and the reagent support tray 700 of FIG. 7 is that sides 990 of the dividers 910 are not parallel in a plane of the support surface 901, as are sides of the dividers 710. Because the sides 990 of the dividers 910 are not parallel, the bores 920 in a narrow portion of the divider 910 may not be as large as bores 921 in a wider part of the divider 910. Employing a reagent support tray 900 having dividers 910 with non-parallel sides 990 thus may allow for increased channel area through the bores 920 and 921 without including additional dividers extending partially across the support surface 901 either partially or fully. Using dividers 910 with non-parallel sides 990 that flare to a greater width than the dividers 710 (FIG. 7) also may permit added structural rigidity of the support surface 901 than may be possible with dividers 710 having parallel widths that span a lesser surface area that the dividers 910.

Figure 10:
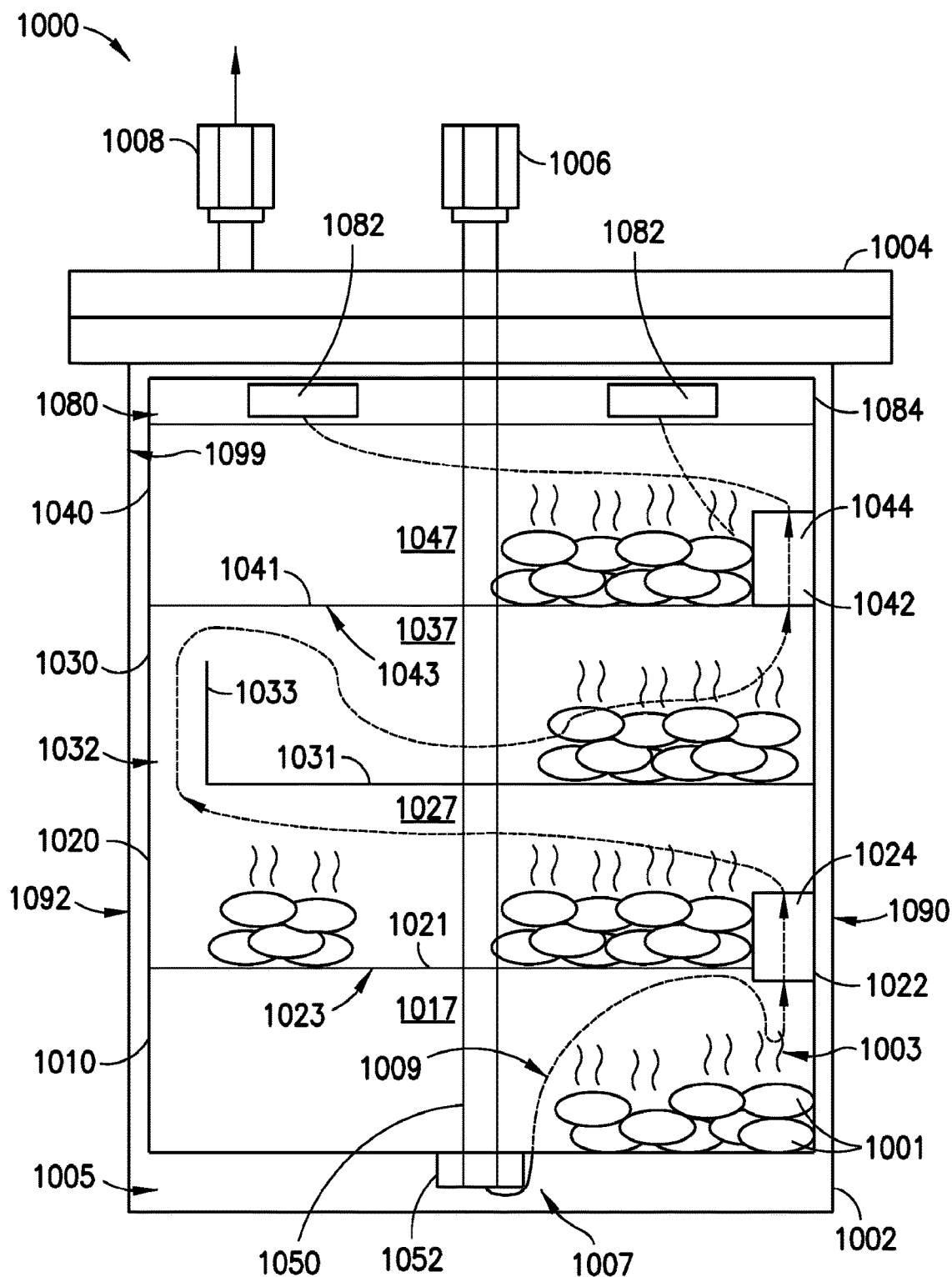

FIG. 10 is side cutaway view of another particular illustrative embodiment of a vaporizer vessel 1000 and associated components according to the present disclosure. The vaporizer vessel 1000 includes a body 1002 and a lid 1004. The lid 1004 includes an inlet port 1006 configured to receive a flow of a carrier gas (not shown in FIG. 1000). The lid 1004 also includes an outlet port 1008 that may produce a mixture of carrier gas and reagent vapor (also not shown in FIG. 1000). When the lid 1004 is secured to the body 1002, using clamps, bolts, or other devices, the body 1002 and the lid 1004 define an enclosed interior volume 1005 of the vaporizer vessel 1000.

In the particular illustrative embodiment of FIG. 10, a plurality of reagent support trays 1010, 1020, 1030, and 1040 of approximately equal size are received. The reagent support trays 1010, 1020, 1030, and 1040 are configured to receive a supply of a source reagent material 1001 that is configured or expected to generate a reagent vapor 1003, as previously described with reference to FIG. 1. It should be understood, and as will be further explained with reference to FIGS. 15-20, that each of the plurality of reagent support trays 1010, 1020, 1030, and 1040 may be of different sizes. Further, although FIG. 10 depicts that the plurality of reagent support trays 1010, 1020, 1030, and 1040 includes four individual reagent support trays, any number of reagent support trays may be used.

The reagent support trays 1010, 1020, 1030, and 1040 and the vaporizer vessel 1000, as previously described with reference to FIG. 1, may be comprised of a thermally conductive material to promote heating of the source reagent materials, but the thermally conductive material may be comprised of metal or another material that, desirably, is nonreactive with the carrier gas, the source reagent material, or the reagent vapor produced by vaporizing the source reagent material. FIG. 10 also depicts the use of at least one particle suppression device 1080 within the vaporizer vessel 1000, wherein the particle suppression device 1080 is positioned between the plurality of reagent support trays 1010, 1020, 1030, and 1040 and the outlet port 1008. In a particular embodiment, the particle suppression device 1080 includes a plurality of parallel filters 1082 separately arranged in a housing 1084. According to a particular embodiment, use of the plurality of separate filters 1082 may enable the particle suppression device 1080 to pass and filter a volume of the carrier gas and reagent vapor mixture at a rate greater than may permitted by a single filter (not shown in FIG. 10).

In operation, the vaporizer vessel 1000, the plurality of reagent support trays 1010, 1020, 1030, and 1040, the source reagent material 1001 and other components may be heated. A flow of carrier gas 1007 may be introduced via the inlet port 1006. In a particular embodiment, the flow of carrier gas 1007 received via the inlet port 1006 is conducted downward to a bottom of the enclosed interior volume 1005 via a downtube 1050. The downtube 1050 enables the flow of carrier gas 1007 to be introduced below a lowermost of the plurality of reagent support trays 1010, 1020, 1030, and 1040, thereby facilitating interaction of the flow of carrier gas 1007 with contents of each of the plurality of reagent support trays 1010, 1020, 1030, and 1040 as the heated carrier gas expands and migrates upward toward the outlet port 1008. The flow of carrier gas 1007 also may be introduced through the downtube 1050 to a flow disperser 1052 to generate a vortex of the carrier gas to further promote interaction between the carrier gas and the source reagent material 1001 within the plurality of reagent support trays 1010, 1020, 1030, and 1040. The carrier gas then interacts with the heated source reagent materials 1001 to generate a gas mixture 1009 of carrier gas 1007, source reagent vapor 1003, and, potentially, spurious particles (not shown in FIG. 10). Particles in excess of a predetermined size are filtered by the separate filters 1082 of the particle suppression device 1080, and the filtered mixture 1090 of carrier gas and source reagent vapor exits the vaporizer vessel 1000 via the outlet port 1008.

In a particular embodiment, the plurality of reagent support trays 1010, 1020, 1030, and 1040 are arranged in a stack and are adapted to cause a gas mixture 1009 flowing through the plurality of reagent support trays 1010, 1020, 1030, and 1040 to pass from side to side to encourage engagement of the gas mixture 1009 with the source reagent material 1001 and reagent vapor 1003 produced by the source reagent material 1001.

As shown in FIG. 10, the plurality of reagent support trays 1010, 1020, 1030, and 1040 are arranged to sequentially redirect a flow of the gas mixture 1009 from a first side 1090 of the vaporizer vessel 1000 (e.g., a right side, as shown in FIG. 10) to a second side 1092 of the vaporizer vessel 1000 (e.g., a left side, as shown in FIG. 10) as the gas mixture 1009 flows between the plurality of reagent support trays 1010, 1020, 1030, and 1040. The redirection of the gas mixture may be accomplished through a series of oppositely disposed gas flow openings 1022, 1032, and 1042 arranged in the plurality of reagent support trays 1010, 1020, 1030, and 1040, as further described below. The gas flow openings used in the plurality of reagent support trays 1010, 1020, 1030, and 1040 may have the same configuration in each of the plurality of reagent support trays 1010, 1020, 1030, and 1040, or the configuration of the gas flow openings may vary between the plurality of reagent support trays 1010, 1020, 1030, and 1040, as shown in FIG. 10.

As the gas mixture 1009 flows through from the reagent support tray 1010 into the reagent support tray 1020 (a superjacent support tray to the reagent support tray 1010), the gas mixture flows toward the first side 1090 because the only passage from a volume 1017 above the reagent support tray 1010 into the reagent support tray 1020 is via the gas flow opening 1022. The gas flow opening 1022 may include an opening in a support surface 1021 of the reagent support tray 1020. The gas flow opening 1022 may be enclosed by a wall 1024 configured to contain the reagent source material 1001 received in the reagent support tray 1020 to prevent the reagent source material 1001 from falling through the gas flow opening 1022 into the reagent support tray 1010. Also, in a particular embodiment, the wall 1024 of the gas flow opening 1022 may extend below a bottom face 1023 of the support surface 1021 to cause a portion of the gas mixture 1009 abutting the bottom face 1023 of the support surface 1021 to circulate away from the bottom face 1023 of the support surface 1023 to reach the gas flow opening 1022. In this way, the gas mixture may be further directed to interact with the source reagent material 1001 and the reagent vapor 1003 in the volume 1017 above the reagent support tray 1010, as shown in FIG. 10 and as also described with reference to FIG. 1.

Once the gas mixture 1009 passes into a volume 1027 above the reagent support tray 1020, the gas mixture 1009 is directed to the second side 1092 of the vaporizer vessel 1000 because the only passage out of the volume 1027 is the gas flow opening 1032, where the gas mixture 1009 may pass into a volume 1037 above the reagent support tray 1030. The gas flow opening 1032 includes a section of the reagent support tray 1030 that does not directly engage interior walls 1099 of the vaporizer vessel 1000, but includes a sidewall 1033 that extends only partially from the support surface 1031 toward a bottom face 1043 of a support surface 1041 of the reagent support tray 1040. The space circumscribed by the sidewall 1033 and the interior walls 1099 of the vaporizer vessel 1000 forms a passage to permit the gas mixture 1009 to flow into a volume 1037 above the reagent support tray 1030. The gas mixture 1009 then flows again to the first side 1090 of the vaporizer vessel 1000 where the gas mixture flows through a gas flow opening 1042 into a volume 1047 above the reagent support tray 1040. The gas flow opening 1042 formed in the reagent support tray 1040 is similar to the gas flow opening 1022 formed in the reagent support tray 1020, except that a wall 1044 of the gas flow opening 1042 does not extend below the bottom face 1043 of the support surface 1041 of the reagent support tray 1040.

Thus, by virtue of the offset gas flow openings 1022, 1032, and 1042, before the gas mixture passes through separate filters 1084 in a housing 1082 of a particle suppression device 1080 and then out of the vaporizer vessel 1000 via the outlet port 1008, the gas mixture 1009 is directed back and forth through the vaporizer vessel 1000 to interact with the source reagent material 1001 and reagent vapor 1003 produced thereby to entrain source reagent in the gas mixture 1009.

Figure 11:
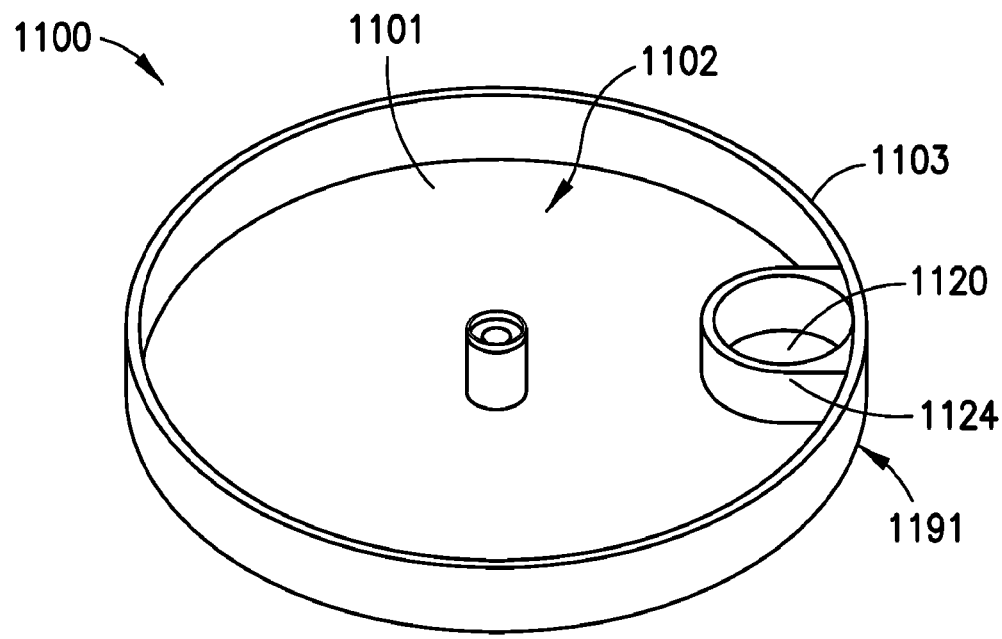
FIG. 11 is perspective view of a particular illustrative embodiment of a reagent support tray according to the present disclosure having a gas flow opening arranged at one side of the reagent support tray inside a sidewall of the reagent support tray.

FIG. 11 is perspective view of a particular illustrative embodiment of a reagent support tray 1100 according to the present disclosure having a gas flow opening 1120 arranged at one side 1191 of the reagent support tray 1120 inside a sidewall 1103 of the reagent support tray 1100. The reagent support tray 1100 includes a support surface 1101 having a top face 1102 configured to receive a supply of source reagent material (not shown in FIG. 11). The gas flow opening 1120 is formed in the support surface 1101 and is circumscribed by a wall 1124 that contains source reagent material (not shown in FIG. 11) received in the reagent support tray 1100 to prevent the source reagent material from falling down through the gas opening 1120, as previously described. Aside from the gas flow opening 1120 and a lack of dividers, the reagent support tray 1100 is comparable to the other reagent support trays previously described.

Figure 12:
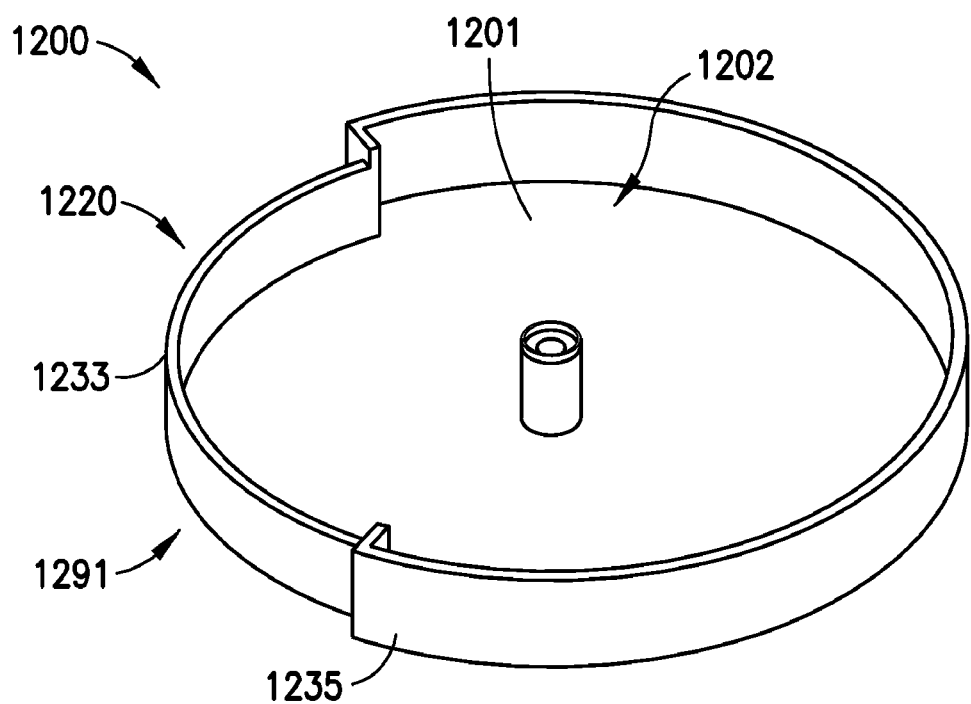
FIG. 12 is perspective view of a particular illustrative embodiment of a reagent support tray according to the present disclosure having a gas flow opening arranged at one side of the reagent support tray between a sidewall of the reagent support tray and an interior wall of the vaporizer vessel.

FIG. 12 is perspective view of a particular illustrative embodiment of another reagent support tray 1200 according to the present disclosure having a gas flow opening 1220 arranged at one side 1291 of the reagent support tray 1120. As previously described with reference to FIG. 10, the reagent support tray 1200, like the reagent support tray 1030 of FIG. 10, defines the gas flow opening 120 between an interior wall of a vaporizer vessel (not shown in FIG. 12) and a portion of a sidewall 1233 of the reagent support tray 1200 at the one side 1291 of the vaporizer vessel. The reagent support tray 1200 includes a support surface 1201 having a top face 1202 configured to receive a supply of source reagent material (not shown in FIG. 12). The support surface 1201 is configured not to extend to or to closely engage the interior wall of the vaporizer vessel, but to leave a gap between the portion of the sidewall 1233 at the one side 1291 of the vaporizer vessel so that the portion of the sidewall 1233 and the interior wall of the vaporizer vessel define the gas flow opening 1120. The portion of the sidewall 1233 that defines the gas flow opening 1220 at the one side 1291 may not extend as high as other portions of a sidewall 1235 so as to leave an opening to permit a gas mixture to flow into a volume above the reagent support tray 1200, such as described with reference to the reagent support tray 1030 of FIG. 10. Aside from the gas flow opening 1220 and a lack of dividers, the reagent support tray 1200 is comparable to the other reagent support trays previously described.

Figure 13:
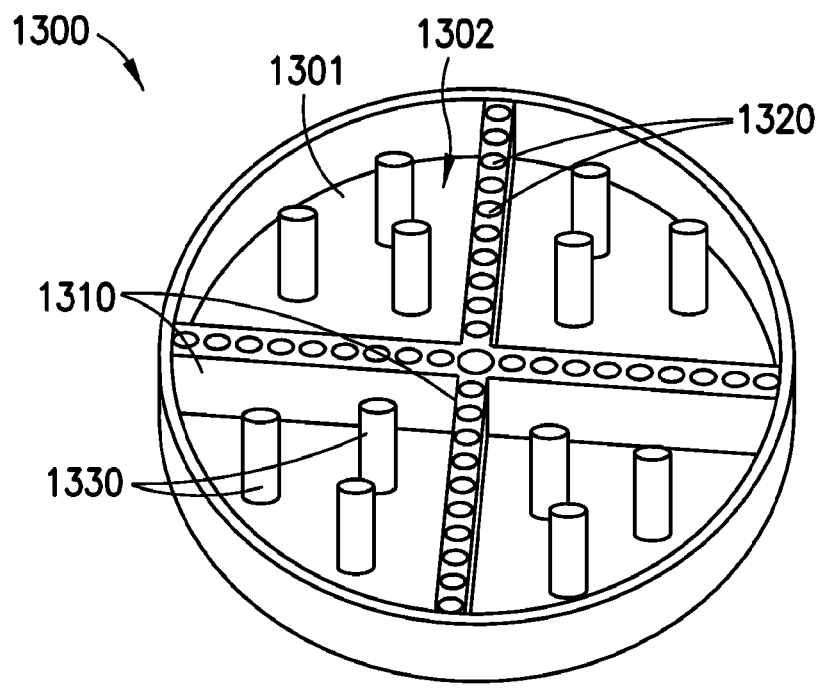
FIG. 13 is perspective view of a particular illustrative embodiment of a reagent support tray similar to the reagent support tray of FIG. 7 that includes a plurality of protuberances extending from the support surface of the reagent support tray.

FIG. 13 is perspective view of a particular illustrative embodiment of a reagent support tray 1300 similar to the reagent support tray 700 of FIG. 7, with the addition of a plurality of protuberances 1330 extending from a top face 1302 of a support surface 1301 of the reagent support tray 1300. The protuberances 1330 are positioned between dividers 1310, which may incorporate a number of channels 1320 extending therethrough, as previously described. In a particular embodiment, the protuberances 1330 are thermally conductive and engage source reagent material (not shown in FIG. 13) that may be supported within the reagent support tray 1300. The thermally-conductive protuberances 1330 thus may be used to enhance distribution of thermal energy throughout a quantity of source reagent material contained in the reagent support tray 1300.

Figure 14:
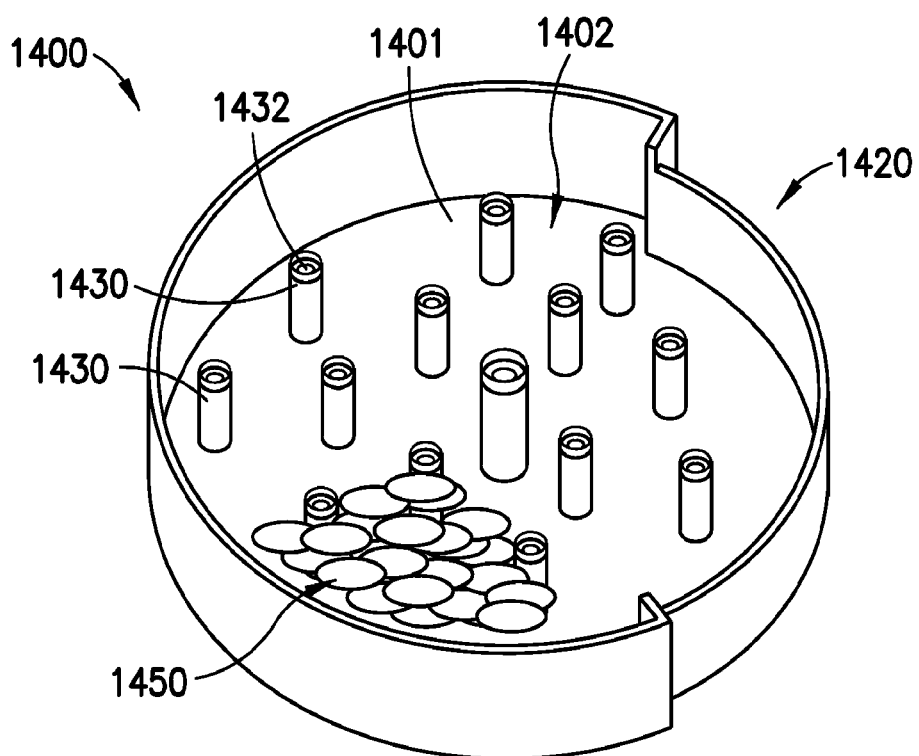
FIG. 14 is perspective view of a particular illustrative embodiment of a reagent support tray similar to the reagent support tray of FIG. 11 that includes a plurality of hollow protuberances extending from the support surface of the reagent support tray.

FIG. 14 is perspective view of a particular illustrative embodiment of a reagent support tray 1400 similar to the reagent support tray 1200 of FIG. 12 with the addition of a plurality of protuberances 1430 extending from a top face 1402 of a support surface 1401 of the reagent support tray 1400. Comparing FIGS. 13 and 14, it may be seen that the protuberances 1330 and 1430 may be used in reagent support trays with or without dividers 1310 (FIG. 13). In a particular embodiment, the protuberances 1430 are thermally conductive and engage source reagent material 1450 that may be supported within the reagent support tray 1400. The thermally-conductive protuberances 1430 thus may be used to enhance distribution of thermal energy throughout a quantity of source reagent material 1450 contained in the reagent support tray 1400.

In a particular embodiment, the protuberances 1430 may include a channel 1432 extending therethrough that extends through the support surface 1401 to convey a flow of gas (not shown in FIG. 14) from below the support surface 1401 into a volume above the reagent support tray 1400. Thus, the channels 1432 may be used in concert with a gas flow opening 1420 to convey a flow of gas between a side of the reagent support tray 1400 and an interior wall of the vaporizer vessel (not shown in FIG. 14) as previously described with reference to FIGS. 10 and 12. Similarly, the protuberances 1330 of FIG. 13 may include channels extending therethrough (not shown in FIG. 13) to work in concert with the channels 1320 in the dividers 1310 to convey a flow of gas from below the support surface 1301 into a volume above the reagent support tray 1300 as previously described. When the protuberances 1330 and 1430 include channels 1432 extending therethrough, lower ends of the protuberances 1330 and 1430 may be flush with a bottom face (not shown) of the support surfaces 1301 and 1401, respectively. Alternatively, the protuberances 1330 and 1430 may extend beneath the bottom face of the support surfaces 1301 and 1401, respectively, to redirect a flow of gas away from the bottom face of the support surfaces 1301 and 1401. Extending the protuberances 1330 and 1430 thus may facilitate interaction between the gas flow and the source reagent material or source reagent vapor below the support surfaces 1301 and 1401 before the gas flow may enter the channels 1432 within the protuberances 1330 and 1430, as described with reference to channels 168 in the dividers 162 and 164 extending below the support surfaces 121 and 131, respectively, as shown in FIG. 1.

FIGS. 15-20 are side cutaway views of particular illustrative embodiments of combinations of reagent support trays having same or different dimensions combined in a stack of reagent support trays to be deployed in a vaporizer vessel. As shown in the examples of FIGS. 15-20, stacks of reagent support trays may include reagent support trays of the same height, whether tall trays or short trays, or various combinations and sequences of trays of different heights. Selecting the combination of one or more reagent support trays having a first height (e.g., a tall tray) and one or more reagent support trays having a second height (e.g., a short tray) may be based on a first proportion of first reagent vapor to be derived from a first reagent source material to be received into the one or more reagent support trays having the first height and a second proportion of second reagent vapor to be derived from a second reagent source material to be received into the one or more of the plurality of reagent support trays having the second height. There also may be some advantages to having one particular source reagent material positioned at a lower level of a vaporizer vessel, positioned at a higher level of a vaporizer level, or interspersed at levels between levels of one or more other reagent source materials.

In the following examples, it is assumed that the reagent support trays may include only reagent support trays of two different: a first height and a second height. However, it should be understood that there may be a range of tray heights including a third height, a fourth height, etc., that may include taller or shorter heights than those represented in FIGS. 1-6 or elsewhere in this description. Also, while the stacks of reagent support trays include a maximum of three reagent support trays of a first height or six reagent support trays of a second height, the stacks could include more or fewer trays of each height. The reagent support trays may include dividers that include channels as described with reference to FIGS. 1-9. The reagent support trays may include gas flow openings positioned on alternate sides, as described with reference to FIGS. 10-12. The reagent support trays may include solid or channeled protuberances, as described with reference to FIGS. 13 and 14. The reagent support trays also may be of other configurations. Moreover, the reagent support trays may include a combination of trays having different features.

Figure 15:
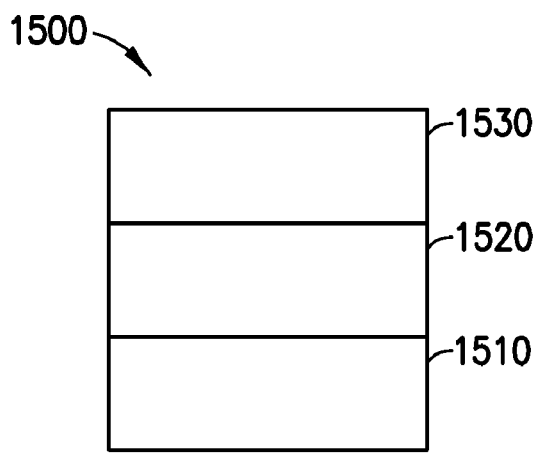
FIGS. 15-20 are side cutaway views of a particular illustrative embodiments of combinations of reagent support trays having same or different dimensions combined in a stack of reagent support trays to be deployed in a vaporizer vessel.
Figure 16:
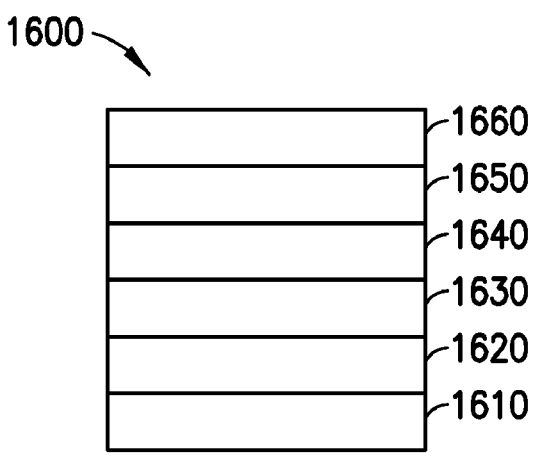

To illustrate examples of different stacks of reagent support trays, FIG. 15 shows a stack of reagent support trays 1500 that includes three reagent support trays 1510, 1520, and 1530 that are all of a first height (e.g., a tall height). FIG. 16 shows a stack of reagent support trays 1600 that includes six reagent support trays 1610, 1620, 1630, 1640, 1650, and 1660 that are all of a second height (e.g., a short height). Thus, a stack of reagent support trays may include only reagent support trays of a same height.

Figure 17:
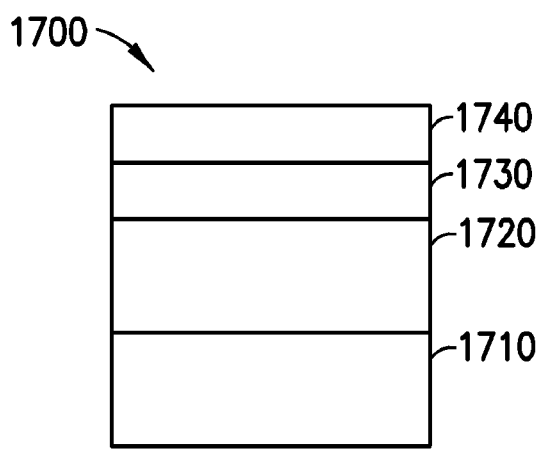
Figure 18:
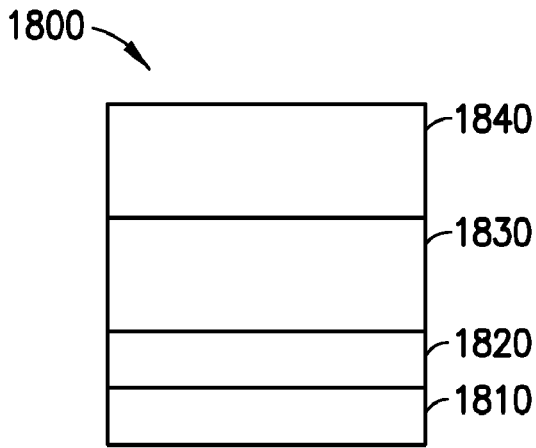
Figure 19:
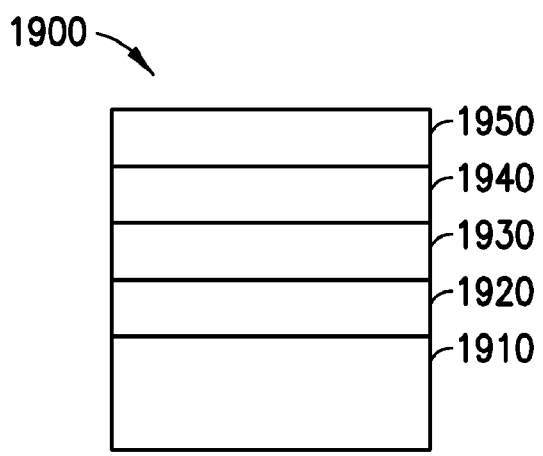
Figure 20:
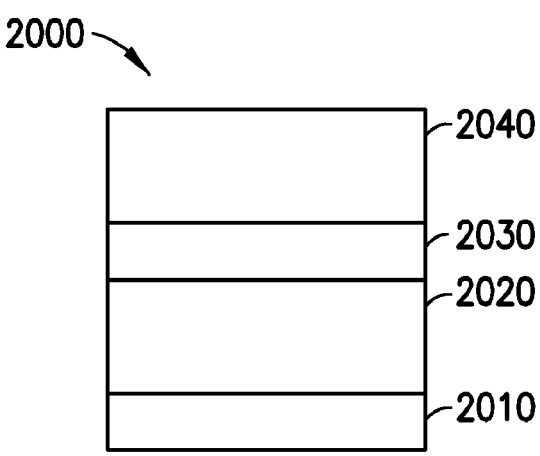

Alternatively, a stack of reagent support trays may include reagent support trays of different heights. FIG. 17 shows a stack of reagent support trays 1700 that includes two reagent support trays 1710 and 1720 of a first height (e.g., a tall height) and two reagent support trays 1730 and 1740 of a second height (e.g., a short height). Although FIG. 17 shows an equal number of reagent support trays of the same height, and the reagent support trays 1730 and 1740 of the second height positioned atop the reagent support trays of the first height 1710 and 1720, the reagent support trays do not have to be selected or stacked in such a way. For example, FIG. 18 shows a stack of reagent support trays 1800 that includes two reagent support trays 1810 and 1820 of a second height (e.g., a short height) stacked below two reagent support trays 1830 and 1840 of a first height (e.g., a tall height). FIG. 19 shows a stack of reagent support trays 1900 that includes a reagent support tray 1910 of a first height (e.g., a tall height) beneath four reagent support trays 1920, 1930, 1940, and 1950 of a second height (e.g., a short height). Alternatively, the reagent support tray of the first height 1910 may be positioned atop the reagent support trays 1920, 1930, 1940, and 1950. Furthermore, reagent support trays of different heights may be interleaved. Thus, as shown in FIG. 20, a stack of reagent support trays 2000 may include two reagent support trays 2010 and 2030 of a second height (e.g., a short height) interleaved among two four reagent support trays 2020 and 2040 of a second height (e.g., a tall height). Thus, any combination of trays in number, height, and feature may be used based on the application, size of the vaporizer vessel, availability of source material, desired proportions of source materials to be included in a gas mixture, etc., without limitation.

Figure 21:
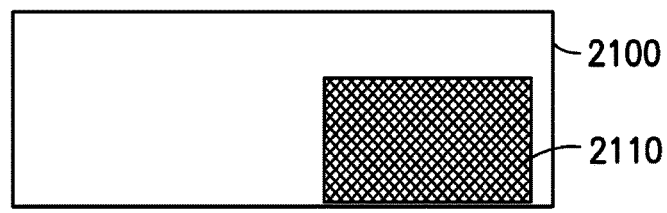
FIGS. 21-25 are side cutaway views of a reagent support tray supporting source reagent materials of different forms.
Figure 22:
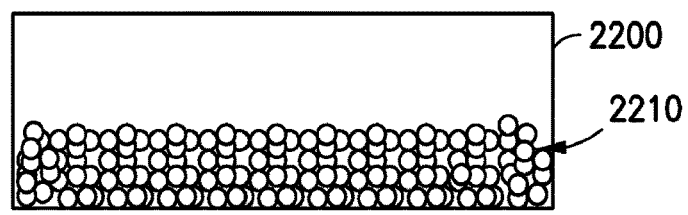
Figure 23:
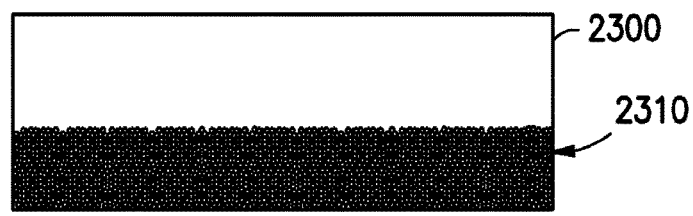
Figure 24:
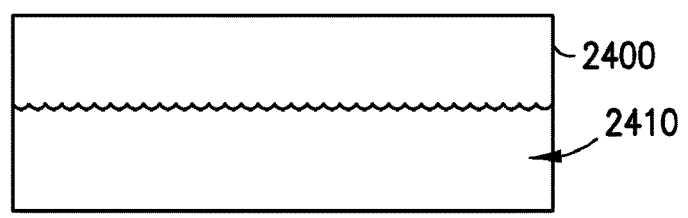
Figure 25:
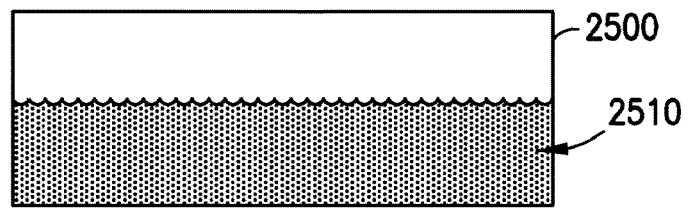

FIGS. 21-25 are side cutaway views of a reagent support tray supporting source reagent materials of different forms. In accordance with embodiments of the present disclosure, various types of solid reagent source materials and liquid reagent source materials may be used. For example, FIGS. 1, 10, and 14 show a source reagent material 101, 1001, and 1450, respectively, in a solid but discontinuous form. However, the source reagent material may be presented in myriad forms. For example, FIG. 21 shows a reagent support tray 2100 that supports a supply of source reagent material in a solid, monolithic block form 2110. FIG. 22 shows a reagent support tray 2200 that supports a supply of source reagent material in a beaded form 2210. FIG. 23 shows a reagent support tray 2300 that supports a supply of source reagent material in a powdered form 2310. FIG. 24 shows a reagent support tray 2400 that supports a supply of source reagent material in a liquid form 2410. FIG. 25 shows a reagent support tray 2500 that supports a supply of source reagent material in a liquid form that includes a solid source material dissolved in a liquid 2510, where the liquid includes a solvent. Source reagent material may be provided in any of these forms.

Moreover, the source reagent material may be received into reagent support trays of any of the forms previously described. As previously described with reference to FIGS. 1, 10, and 14, solid source reagent material in a discontinuous form may be received into reagent support trays that include channeled dividers, support trays that include gas flow openings on a single side, or reagent support trays that include protuberances extending therethrough. These same types of reagent support trays may accommodate source reagent material in a solid, monolithic form 2110 (FIG. 21), reagent source material in a beaded form 2210 (FIG. 22), reagent source material in a powdered form 2310 (FIG. 23), reagent source material in a liquid form 2410 (FIG. 24), or reagent source material including a solid regent source material dissolved in a solvent or other liquid 2510 (FIG. 25).

Figure 26:
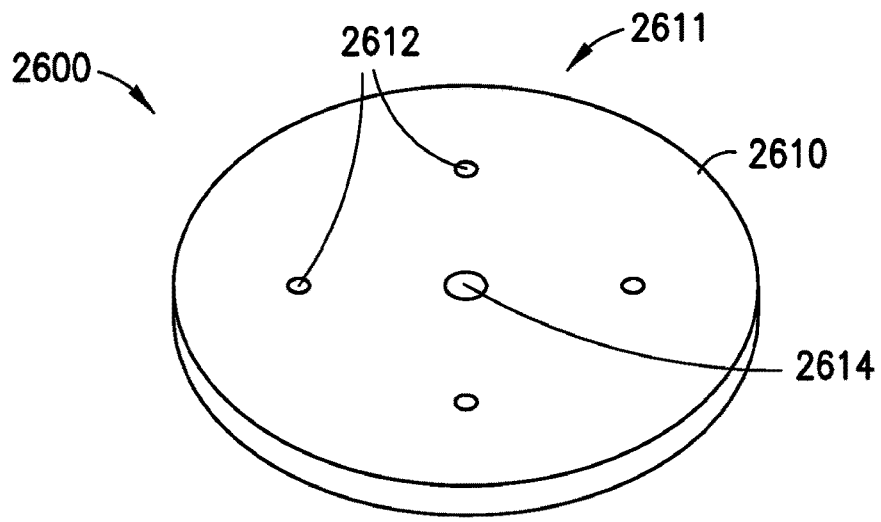
FIG. 26 is perspective view of an upper surface of a particular illustrative embodiment of a particle suppression device employing a plurality of separately, parallel filters according to the present disclosure.
Figure 27:
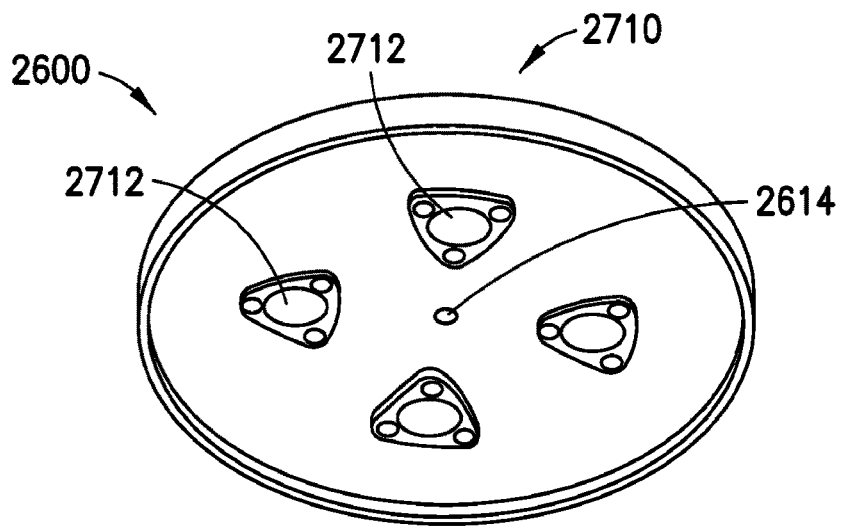
FIG. 27 is perspective view of a lower surface of a particular illustrative embodiment of a particle suppression device employing a plurality of separate, parallel filters according to the present disclosure.

FIG. 26 is top perspective view of an upper surface 26 10 of a particular illustrative embodiment of a particle suppression device 2600 employing a plurality of separate, parallel filters (not shown in FIG. 26) according to the present disclosure. As described with reference to FIGS. 1, 2, and 10 the particle suppression device 2600 may be positioned between reagent support trays 110, 120, 130, and 140 of the vaporizer vessel 100 FIG. 1 and the outlet port 108, between the reagent support trays 210, 220, 230, and 240 of the vaporizer vessel 200 and the outlet port 208, or between the reagent support trays 101, 1020, 1030, and 1040 of the vaporizer vessel 1000 and the outlet port 1008. The particle suppression device 2600 is thus configured and positioned to intercept particles in excess of a predetermined size and to prevent said particles from flowing out of the outlet port 108, 208, or 1008 as part of a gas mixture exiting the vaporizer vessels 100, 200, and 1000, respectively.

In a particular embodiment, the particle suppression device includes a plurality of parallel filters separately arranged in a housing 2610. Outlets 2612 in the housing 2610 are shown in FIG. 26 in an upper surface 2611 of the housing 2610 of the particle suppression device 2600. The use of multiple parallel filters separately arranged about the housing 2610 of the particle suppression device 2600 may enable filtering and passage of a greater volume of gasses than may be possible using a comparable single filter, thereby supporting the generation of a larger flux of reagent vapor.

The upper surface 2611 of the housing 2610 of the particle suppression device 2600 may also include a central opening 2614 to receive a downtube 150, 250 or 1050 as described with FIGS. 1, 2, and 10, respectively. The central opening 2614 desirably is sized to closely fit the outer dimensions of downtube and may be further fitted with a gasket to prevent gasses from exiting via the central opening 2614 and thereby bypassing the plurality of filters in the particle suppression device.

FIG. 27 is bottom perspective view of a lower surface 2711 of the housing 2610 of a particular illustrative embodiment of the particle suppression device 2600. FIG. 27 shows a plurality of separate, parallel filters 2712 according to the present disclosure. The plurality of filters 2712 cover each of the outlets 2612 (FIG. 12) in the housing 2610 of the particle suppression device 2600 to intercept and filter out particles over a predetermined size.

Each of the plurality of filters 2712 may include a single filtration element or may include multiple filter components coupled in series with one another to successively filter out particles of different sizes, as further described with reference to FIG. 28, below.

FIG. 28 is a cross-sectional view of one of the filters 2712 of FIG. 27 showing a plurality of filter elements 900 that may be included among multiple filter elements in one or more of the plurality of filters 2712. For example, one or more of the plurality of filters 2712 may include a plurality of filter elements 2800 that includes at least one frit 2810 configured to prevent the passage therethrough of a particle having a size greater than a first predetermined acceptable size. Alternatively or additionally, one or more of the plurality of filters 2712 may include a plurality of filter elements 2800 that includes a thermally conductive mesh or foam material 2820, such as a metal foam material that, for example, may be formed of aluminum or stainless steel. The thermally conductive mesh or foam material may be configured to prevent the passage therethrough of a particle having a size greater than a second predetermined acceptable size, where the second predetermined acceptable size is smaller than the first predetermined acceptable size. In addition, one or more of the plurality of filters 2712 may include a plurality of filter elements 2800 that includes at least one additional filter 2830 comprised of a batting, fabric, or other material. The at least one additional filter 930 may be configured to prevent the passage therethrough of a particle having a size greater than either the first or the second predetermined acceptable size. In such a configuration, a filter including the plurality of filter elements 900 may successively filter out particles of increasingly smaller sizes to prevent said particles from being included in a gas mixture generated by a vaporizer vessel.

FIG. 29 is a simplified block diagram of a deposition or implantation system 2900 using a vapor delivery system according to the present disclosure. The system 2900 includes a vaporizer vessel 2910, such as previously described with reference to FIGS. 1 and 2 and using components and materials such as described with reference to FIGS. 1-28. A carrier gas source 2920 is connected to the vaporizer vessel 2910 to provide a flow of carrier gas. In alternative modes of introducing a source material, a liquid source material may be introduced into the vaporizer vessel 2910 from a liquid source container 2930, or the vaporizer vessel 2910 may otherwise be pre-filled with a solid source reagent material in a granular, powdered, bead, porous solid, or other form (not shown in FIG. 29). An inlet port of the vaporizer vessel 2910 may be equipped with an input valve 2912. The input valve 2912 may include a flow control valve arranged to damp surges in the flow of carrier gas into the enclosed interior volume of the vaporizer vessel 2910 upon initiation of the flow of the carrier gas from the carrier gas source 2920. Correspondingly, an outlet port of the vaporizer vessel 2910 may be equipped with an output valve 2914. The output valve 2914 may include a gate overflow valve configured to limit pressure rise accompanying surges of the flow of the carrier gas into the enclosed interior volume of the vaporizer vessel 2910 upon initiation of the flow of the carrier gas from the carrier gas source 2920 into the enclosed interior volume of the vaporizer vessel 2910.

A flow rate of the carrier gas supplied by the carrier gas source 2920 may be monitored and controlled by an input gas flow meter 2922 disposed in the carrier gas delivery line 2924. A flow rate of gas output from the vaporizer vessel 2910 and supplied to a processing unit 2940 may be monitored and controlled by an output gas flow meter 2942 disposed in the carrier gas delivery line 2944. In a particular embodiment, the process unit 2940 includes a batch processing unit that may simultaneously perform deposition or implantation of materials on a plurality of wafers or other units 2948.

The vaporizer vessel 2910 may also be coupled with a temperature control assembly 2950 configured to control temperature of the vaporizer vessel 2910. The temperature control assembly 2950 may be configured to enable temperature cycling of the vaporizer vessel 2910 between selected temperatures to facilitate vaporization of the source reagent material. The temperature control system 2950 may include any type of heat regulating system including, without limitation, strip heaters, radiant heaters, heated enclosures, circulating fluid heaters, resistant heating systems, inductive heating systems, etc., as constructed and arranged for controlled temperature operation. Temperature within the vaporizer vessel 2910 can be sensed by a thermocouple, thermistor, or any other suitable temperature sensing junction or device arranged for contacting a surface of the vaporizer vessel 2910 and/or reagent support trays (not shown in FIG. 29) contained therein. Such temperature sensing device can be operatively coupled with a central processing unit, such as a general-purpose programmable computer, programmable logic unit, microcontroller, etc., as arrange to receive temperature sensing signals from the temperature sensing device, and to responsively modulate the heater, and/or other controllable elements of the vaporization system, to achieve a desired production of source reagent vapor for the specific application involved.

The vaporizer vessel 2910 may also be coupled with a process monitoring system 2960 configured to monitor and/or control at least one process variable correlative with generation of one of vapor and particles from the source reagent material in the vaporizer vessel 2910. For example, the process monitoring system 2960 may be configured, in conjunction with the temperature control assembly 2950, to modulate temperature of the vaporizer vessel 2910 based on the at least one process variable being monitored. For example, the process monitoring system may be configured to monitor temperature of the source reagent material (not shown in FIG. 29) within the vaporizer vessel 2910 and modulate the temperature control assembly 2950 so that the source reagent material is maintained at a desired temperature or cycled between a range of desired temperatures. The process monitoring system 2960 also may be used to determine when the vaporizer vessel 2910 is depleted of source material, or to perform other functions.

The process monitoring system 2960 may include a gas phase reagent monitoring system 2962. In a particular embodiment, the gas phase reagent monitoring system 2962 may measure a quantity or concentration of source reagent vapor in a stream of a gas mixture either within the vaporizer vessel 2910 or being output by the vaporizer vessel via the output valve 2914. The resulting measurements may be used to provide feedback for adjusting the temperature of the vaporizer vessel 2910 via the temperature control assembly 2950, to adjust temperature or flow rate of the of the carrier gas dispensed from the carrier gas source 2920, or to adjust other controllable quantities. The gas phase reagent monitoring system may use one or more sensing techniques including, but not limited to, Infrared spectroscopy, Raman spectroscopy, or Mass spectrometry. The concentration data thus may be used to modulate the temperature of the source reagent and/or the flow of the carrier gas to achieve appropriate material flux as need to support the deposition or implantation process.

A vaporizer vessel subject to introduction of improved reagent support trays, particle suppression devices, or other features described herein, is commercially available from ATMI, Inc., Danbury, Conn. USA under the trademark ProE-Vap®. The ProE-Vap vaporizer utilizes stacked trays containing the source reagent. In such vaporizer, the carrier gas is introduced from the upper end and flows through a downwardly extending feed tube to a bottom portion of the vessel for subsequent distribution and upward flow through each tray in the interior volume of the vessel. In such manner, the vessel, when heated, conductively heats the trays in the vessel interior volume, to produce vapor deriving from the source reagent on the trays. The generated vapor then is entrained in the carrier gas. The resulting carrier gas mixture including the source reagent vapor then is discharged from the vaporizer at the upper end thereof through an output port of the vessel. From the outlet port, the carrier gas mixture containing the source reagent vapor passes to the discharge valve of the vaporizer. The discharge valve can be coupled to flow circuitry associated with a downstream processing unit, e.g., a chemical vapor deposition chamber, ALD chamber, or ion implanter, for flow of the carrier gas mixture containing the source reagent vapor, from the vaporizer vessel to such downstream fluid-processing facility.

Other vaporizers can be utilized in the practice of the present disclosure, including the vaporizer described in European Patent Application 1508631 published Feb. 23, 2005 for "Method and Apparatus for the Delivery of Precursor Materials," the disclosure of which hereby is incorporated herein by reference.

Another illustrative vaporizer that may be utilized in the broad practice of the present disclosure is described in U.S. Patent Application Publication 2006/0024439 published Feb. 2, 2006 for "System for Controlling the Sublimation of Reactants," the disclosure of which also is hereby incorporated herein by reference.

Other vaporizers that may be utilized in the broad practice of the present disclosure are described in U.S. Pat. No. 6,921,062 issued Jul. 26, 2005 for "Vaporizer Delivery Ampoule," the disclosure of which also is incorporated herein by reference.

Figure 30:
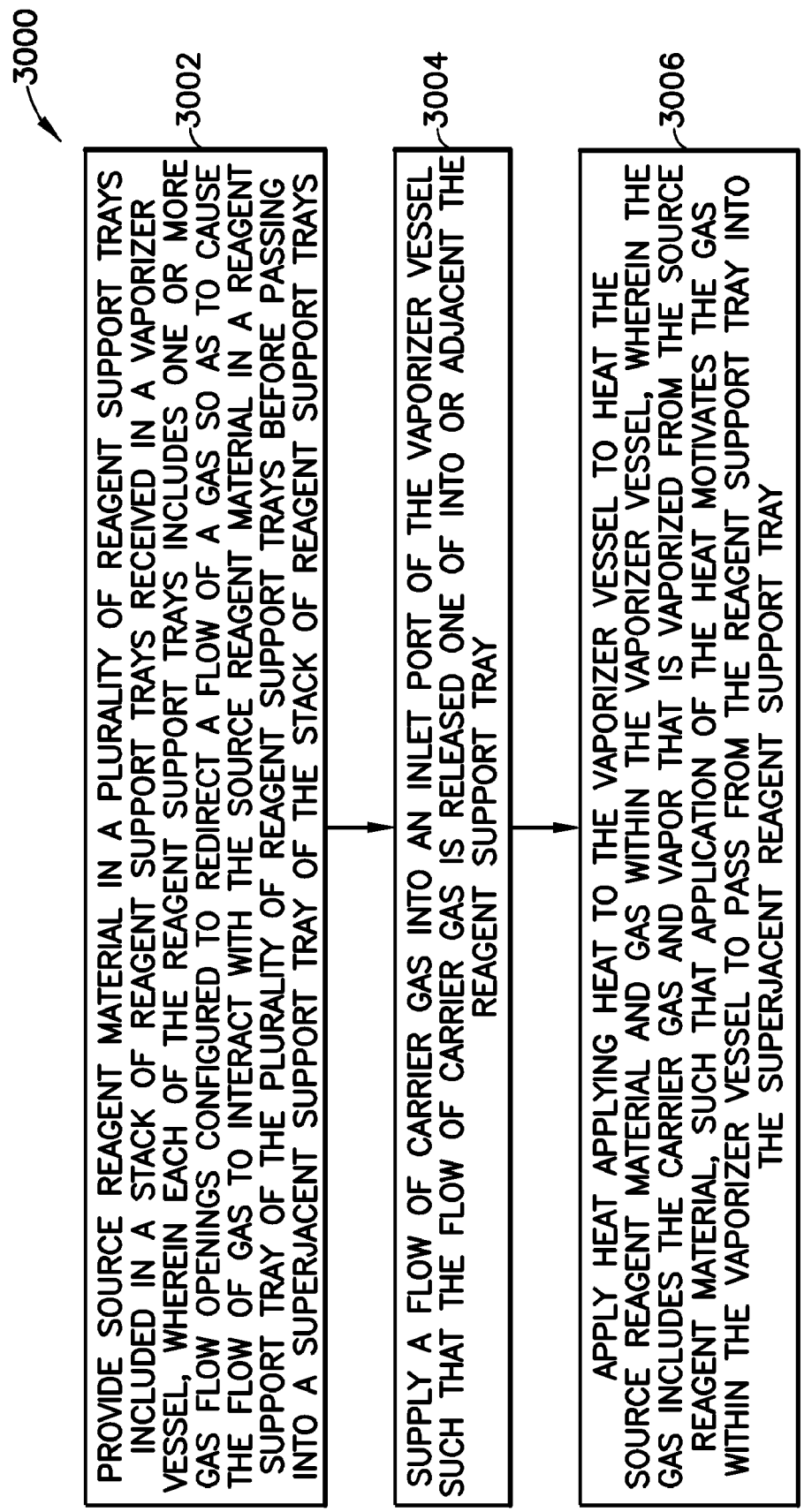
FIG. 30 is a flow diagram of a particular illustrative embodiment of a method for generating reagent vapor from reagent source material using embodiments of reagent support trays according to the present disclosure.

FIG. 30 is a flow diagram of a particular illustrative embodiment of a method 3000 for generating reagent vapor from reagent source material using embodiments of reagent support trays, such as those described with reference to FIGS. 1-25, according to the present disclosure.

At 3002, source reagent material is provided in a plurality of stackable reagent support trays included in a stack of reagent support trays received in a vaporizer vessel. Each of the reagent support trays may include one or more gas flow openings configured to redirect a flow of a gas so as to cause the flow of gas to interact with the source reagent material in a reagent support tray of the plurality of reagent support trays before passing into a superjacent support tray of the stack of reagent support trays. The one or more gas flow openings may include channels in dividers, as described with reference to FIGS. 1-9, gas flow openings in a side of a reagent support tray, as described with reference to FIGS. 10-12, and/or channeled protuberances as described with reference to FIG. 14.

Figure 29:
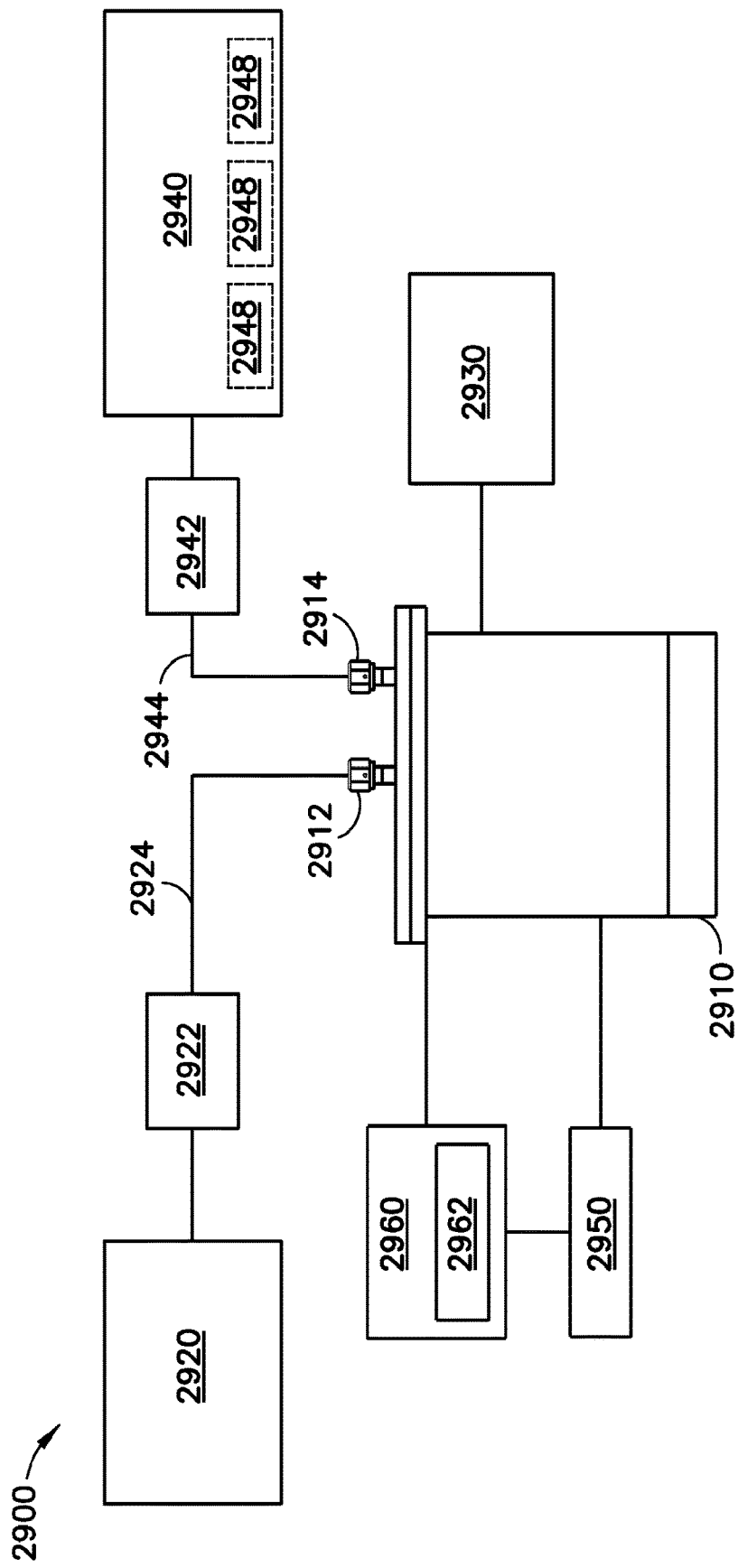
FIG. 29 is a block diagram of a deposition or implantation system using a vapor delivery system according to the present disclosure.

At 3004, a flow of carrier gas is supplied into an inlet port of the vaporizer vessel such that the flow of carrier gas is released the reagent support tray. FIG. 29, for example, shows a carrier gas source adapted for supplying a flow of carrier gas to a vaporizer vessel. At 3006, heat is applied to the to the vaporizer vessel to heat the source reagent material and gas within the vaporizer vessel. The gas may include carrier gas and source reagent vapor that is vaporized from the source reagent material, such that application of the heat motivates the gas within the vaporizer vessel to pass from the reagent support tray into the superjacent reagent support tray. FIG. 29, for example, depicts devices to introduce heat into a vaporizer vessel.

Figure 31:
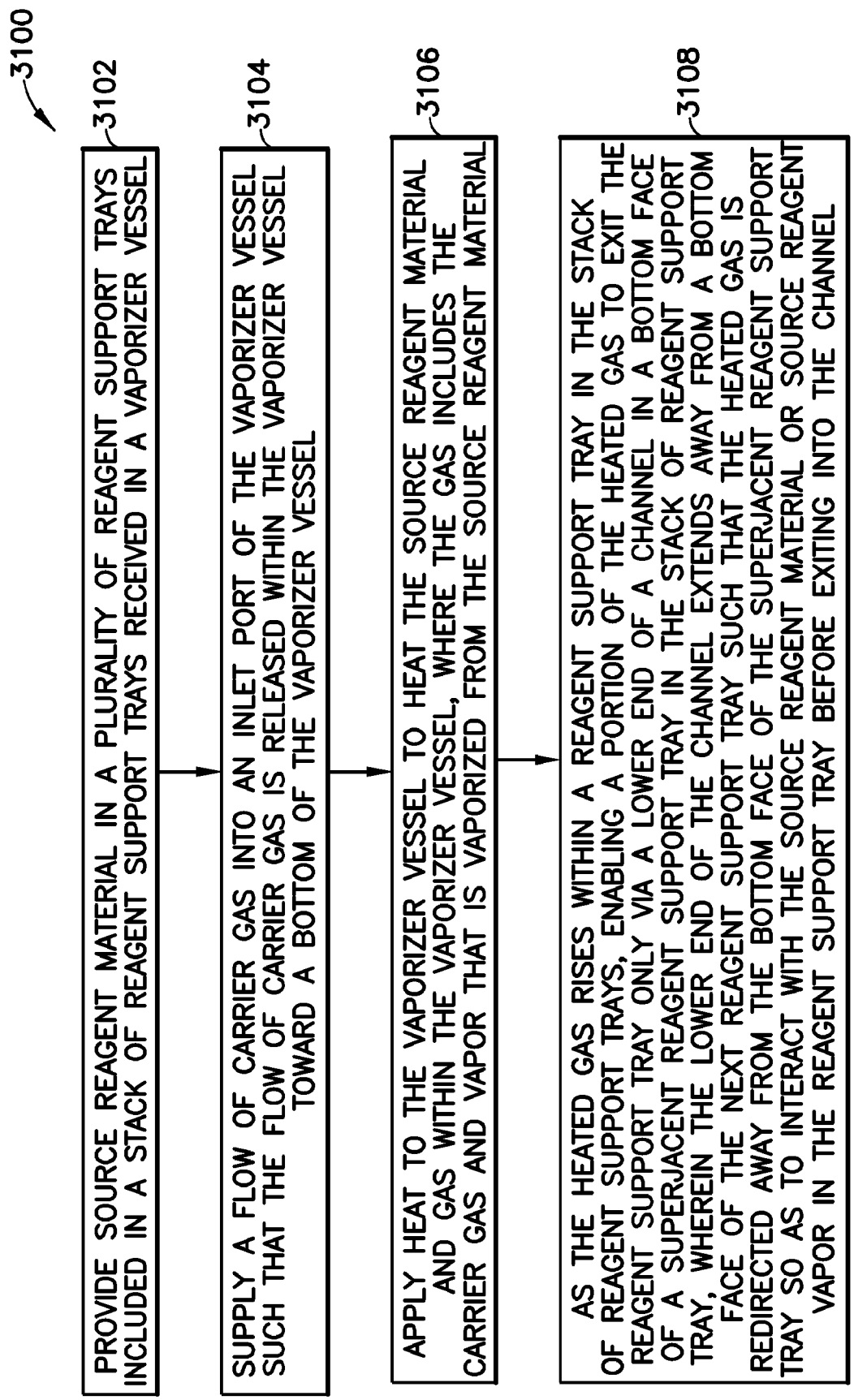
FIG. 31 is a flow diagram of another particular illustrative embodiment of a method for generating reagent vapor from reagent source material using embodiments of reagent support trays according to the present disclosure.

FIG. 31 is a flow diagram of another particular illustrative embodiment of a method 3100 for generating reagent vapor from reagent source material using embodiments of reagent support trays, such as those described with reference to FIGS. 1-25, according to the present disclosure.

At 3102, a source reagent material is provided in a plurality of reagent support trays included in a stack of reagent support trays received in a vaporizer vessel. Stacks of reagent support trays are shown in FIGS. 1, 2, 10, and 15-20. At 3104, a flow of carrier gas is supplied into an inlet port of the vaporizer vessel such that the flow of carrier gas is released within the vaporizer vessel toward a bottom of the vaporizer vessel. FIG. 29, for example, shows a carrier gas source adapted for supplying a flow of carrier gas to a vaporizer vessel. At 3106, heat is applied to the vaporizer vessel to heat the source reagent material and gas within the vaporizer vessel, where the gas includes the carrier gas and vapor that is vaporized from the source reagent material. FIG. 29, for example, depicts devices to introduce heat into a vaporizer vessel.

At 3108, as the heated gas rises within a reagent support tray in the stack of reagent support trays, a portion of the heated gas is enabled to exit the reagent support tray only via a lower end of a channel in a bottom face of a superjacent reagent support tray in the stack of reagent support trays. The lower end of the channel extends away from a bottom face of the next reagent support tray such that the heated gas is redirected away from the bottom face of the superjacent reagent support tray so as to interact with the source reagent material or source reagent vapor in the reagent support tray before exiting into the channel. Redirection of such heated gas is described with reference to FIG. 1.

FIG. 32 is a flow diagram of another particular illustrative embodiment of a method 3200 for generating reagent vapor from reagent source material using embodiments of reagent support trays, such as those described with reference to FIGS. 1-25, according to the present disclosure.

At 3202, a source reagent material is provided in a plurality of reagent support trays included in a stack of reagent support trays received in a vaporizer vessel. Stacks of reagent support trays are shown in FIGS. 1, 2, 10, and 15-20. At 3204, a flow of carrier gas is supplied into an inlet port of the vaporizer vessel such that the flow of carrier gas is released within the vaporizer vessel toward a bottom of the vaporizer vessel. FIG. 29, for example, shows a carrier gas source adapted for supplying a flow of carrier gas to a vaporizer vessel. At 3206, heat is applied to the vaporizer vessel to heat the source reagent material and gas within the vaporizer vessel, where the gas includes the carrier gas and vapor that is vaporized from the source reagent material. FIG. 29, for example, depicts devices to introduce heat into a vaporizer vessel.

At 3208, as the heated gas rises within the vaporizer vessel, a portion of the heated gas is enabled to pass into a first reagent support tray of the stack of reagent support trays via a first gas flow opening on a first side of the stack of reagent support trays. At 3210, as the heated gas continues to rise within the vaporizer vessel, the portion of the heated gas is enabled to pass out of the first reagent support tray only via a second gas flow opening in a second of the plurality of reagent support trays. The second gas flow opening is on a second side of the stack of reagent support trays opposite the first side of the stack of reagent support trays. Redirection of gas in this manner is described with reference to FIG. 10.

FIG. 33 is a flow diagram of a particular illustrative embodiment of a method 1200 for generating reagent vapor to be used in batch processing, such as deposition or implantation of materials, for a plurality of units according to the present disclosure. According to a particular embodiment, the reagent vapor is generated using a vaporizer vessel, such as previously described with reference to FIGS. 1, 2, and 10.

At 3302, a source reagent material is positioned in a plurality of stacked reagent support trays in a vaporizer vessel. Each of the reagent support trays may include a plurality of generally unobstructed sections separated by a plurality of generally hollow dividers configured to enable gases to flow between the plurality of reagent support trays, such as described with reference to FIGS. 1-9. As previously described, the generally hollow dividers may include a slot-shaped channel extending therethrough, or a plurality of generally parallel bores extending through the dividers. Alternatively, as described with reference to FIGS. 10-12, the plurality of reagent support trays may include gas flow openings adapted to cause a flow of gas to travel from side to side while moving through a vaporizer vessel.

At 3304, a flow of carrier gas is supplied into an inlet port of the vaporizer vessel, as also described with reference to FIGS. 1, 10 and 29. At 3304, the source reagent material is heated by applying heat to the vaporizer vessel, such as described with reference to FIG. 29.

At 3308, a mixture of carrier gas and reagent vapor produced in response to the heating of the vaporizer vessel is filtered by passing the mixture of the carrier gas and the reagent vapor through a plurality of parallel filters. The plurality of parallel filters, such as described with reference to FIGS. 1, 2, 7, 8, and 9, are configured to prevent particles in excess of a predetermined size from exiting the vaporizer vessel. The plurality of parallel filters enables filtering of the mixture of the carrier gas and the reagent vapor at a greater rate than achievable using a single filter.

While embodiments have been has been described herein in reference to specific aspects, features and illustrative embodiments of the disclosure, it will be appreciated that the utility of the embodiments is not thus limited, but rather extends to and encompasses numerous other variations, modifications and alternative embodiments, as will suggest themselves to those of ordinary skill in the field, based on the disclosure herein. Correspondingly, the embodiments as hereinafter claimed are intended to be broadly construed and interpreted, as including all such variations, modifications and alternative embodiments, within its spirit and scope.

What is claimed is:

1. A system comprising:
a vaporizer vessel having one or more interior walls and a lid enclosing an interior volume;
an inlet port and an outlet port associated with said lid for a flow of carrier gas;
a plurality of reagent support trays within said interior volume, wherein each of the plurality of reagent support trays is configured to engage the one or more interior walls and to engage a downtube coupled to the inlet port, the support tray including an opening through which the downtube extends, the downtube enabling the flow of carrier gas to be introduced below a lowermost of the plurality of reagent support trays, and wherein:
each of the plurality of reagent support trays includes a support surface having a top face configured to support a supply of source reagent material and a bottom face, and one or more channels that extend through the support surface;
each of the plurality of reagent support trays further includes a sidewall extending from a lower edge to an upper edge in a vertical direction away from the support surface and surrounds an outer periphery of the support surface, wherein the sidewall is configured to engage the one or more interior walls along the outer periphery of the support surface and wherein the lower edge of the sidewall of a particular reagent support tray of the plurality of reagent support trays is configured to engage the upper edge of the sidewall of a subjacent reagent support tray of the plurality of reagent support trays;
each of the plurality of reagent support trays has a height measured from the bottom edge of the support surface to the uppermost edge of the sidewall, wherein at least two reagent support trays of the plurality of reagent support trays have different heights; and
the plurality of reagent support trays is configured to be vertically stackable within the interior volume to form a stack of reagent support trays, wherein one or more of the plurality of reagent support trays is configured to redirect a flow of a gas passing between two or more adjacent reagent support trays in the stack of reagent support trays so as to cause the flow of gas to interact with the supply of source reagent material in one of the plurality of reagent support trays in the stack of reagent support trays before passing into a next of the plurality of reagent support trays in the stack of reagent support trays.

2. The system of claim 1, wherein each of the plurality of reagent support trays includes at least one divider extending at least partially across the support surface, the at least one divider having a lower end extending a first distance below the bottom face, and an upper end, and at least one channel extending through the at least one divider between the lower end and the upper end, wherein gas below the bottom edge is forced to circulate away from the bottom face to reach the at least one channel at the lower end of the at least one divider.

3. The system of claim 2, wherein each of the plurality of reagent support trays is configured to closely engage the one or more interior walls such that the at least one channel of the at least one divider provides an only passage for the gas to flow from below the bottom face to above the top face.

4. The system of claim 2, wherein upon the subjacent reagent support tray being vertically stacked beneath the particular reagent support tray, the at least one divider of the subjacent reagent support tray is configured to be offset from the at least one divider of the particular reagent support tray such that a flow of the gas below the bottom edge of the subjacent reagent support tray that passes through the at least one channel of the at least one divider of the subjacent reagent support tray does not flow linearly into the at least one channel of the at least one divider of the particular reagent support tray.

5. The system of claim 4, wherein upon the subjacent reagent support tray being vertically stacked beneath the particular reagent support tray, a subjacent upper end of the at least one divider of the subjacent reagent support tray extends to within a second distance of the bottom edge of the support surface of the particular reagent support tray, and wherein the first distance is greater than the second distance such that the flow of the gas passing from the at least one channel of the at least one divider of the subjacent reagent support tray must circulate away from the bottom edge of the particular reagent support tray to reach the at least one channel at the lower end of the at least one divider of the particular reagent support tray.

6. The system of claim 2, wherein the at least one divider is generally hollow such that the at least one channel includes a slot extending through the at least one divider.

7. The system of claim 2, wherein the at least one divider includes a plurality of bores extending therethrough, wherein the plurality of bores form a plurality of generally parallel channels extending through each of the plurality of dividers.

8. The system of claim 2, wherein at least one of the plurality of reagent support trays includes at least one divider extending fully across the support surface.

9. The system of claim 2, wherein the at least one reagent support tray includes at least one divider extending partially across the support surface.

10. The system of claim 2, wherein the at least one reagent support tray includes at least one divider having generally parallel sides in a plane defined by the support surface.

11. The system of claim 2, wherein the at least one reagent support tray includes at least one divider having nonparallel sides in a plane defined by the support surface.

12. The system of claim 2, wherein the at least one reagent support tray includes at least one divider extending fully across the support surface and the support tray includes no dividers extending only partially across the support surface.

13. The system of claim 2, wherein each of the plurality of reagent support trays includes an opening configured to permit a tube to extend through the at least one divider and the support surface, wherein the tube is configured to flow a carrier gas either from a top portion of the vaporizer vessel to a lower portion of the interior volume of the vaporizer vessel, or from a lower portion of the interior volume of the vaporizer vessel to a top portion of the vaporizer vessel.

14. The system of claim 1 where reagent support trays which are positioned at a lowermost end of the stack of reagent support trays have a first height that is greater than a second height of reagent support trays which are positioned at an uppermost end of the stack or reagent support trays.

15. The system of claim 1 where reagent support trays which are positioned at a lowermost end of the stack of reagent support trays have a first height that is greater than a second height of reagent support trays which are positioned at an uppermost end of the stack of reagent support trays, said one or more channels extend through the support surface to convey a flow of gas from below the support surface into a volume above the reagent support tray.

16. The system of claim 1, further comprising at least one particle suppression device within the vaporizer vessel, wherein the at least one particle suppression device is positioned between the plurality of reagent support trays and the outlet port, and wherein the at least one particle suppression device is configured so that the carrier gas passes through the at least one particle suppression device before reaching the outlet port.

17. The system of claim 15, further comprising at least one particle suppression device within the vaporizer vessel, wherein the at least one particle suppression device is positioned between the plurality of reagent support trays and the outlet port, and wherein the at least one particle suppression device is configured so that the carrier gas passes through the at least one particle suppression device before reaching the outlet port.

18. The system of claim 1, wherein each of the plurality of reagent support trays is configured to generate reagent vapor as the flow of gas interacts with the supply of source reagent material and the at least two reagent support trays having different heights are configured to provide different proportions of source reagent materials in the reagent vapor.

19. The system of claim 1, wherein at least one of the plurality of reagent support trays includes a portion of its sidewall configured to engage the one or more interior walls of the vaporizer vessel and another portion of its sidewall configured to be spaced from the one or more interior walls of the vaporizer vessel to form a gas flow opening.

20. The system of claim 1, wherein the support surface of each of the plurality of reagent support trays is horizontal.

21. The system of claim 1, further comprising a gasket between the lower edge of the sidewall of the particular reagent support tray and the upper edge of the sidewall of the subjacent reagent support tray.

22. The system of claim 1, wherein the top face of the particular reagent support tray and the bottom surface of a superjacent reagent support tray contain a volume, wherein the bottom face of the particular reagent support tray and the top surface of the subjacent reagent support tray contain a subjacent volume, and wherein the subjacent volume is greater than the volume.

* * * * *